United States Patent
Yamashita

(10) Patent No.: US 8,348,366 B2
(45) Date of Patent: Jan. 8, 2013

(54) WIRING BOARD

(75) Inventor: Toru Yamashita, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 479 days.

(21) Appl. No.: 12/625,980

(22) Filed: Nov. 25, 2009

(65) Prior Publication Data

US 2010/0128075 A1    May 27, 2010

(30) Foreign Application Priority Data

Nov. 27, 2008 (JP) ................. 2008-301868

(51) Int. Cl.
*B41J 29/38* (2006.01)
*B41J 2/015* (2006.01)

(52) U.S. Cl. ............... 347/9; 347/10; 347/11; 347/20

(58) Field of Classification Search ............ 347/5, 20, 347/9–11, 19, 14–15
See application file for complete search history.

(56) References Cited

U.S. PATENT DOCUMENTS

| | | | |
|---|---|---|---|
| 6,702,413 B2 | 3/2004 | Takabayashi et al. | |
| 2002/0180815 A1* | 12/2002 | Nou | 347/10 |
| 2006/0044363 A1* | 3/2006 | Katayama | 347/71 |
| 2008/0030554 A1* | 2/2008 | Sugahara | 347/70 |
| 2008/0198186 A1* | 8/2008 | Hayakawa | 347/6 |
| 2008/0198203 A1* | 8/2008 | Fujii et al. | 347/70 |
| 2009/0033699 A1* | 2/2009 | Han | 347/12 |

FOREIGN PATENT DOCUMENTS

| | | |
|---|---|---|
| JP | 2002-210969 A | 7/2002 |
| JP | 2003-326726 A | 11/2003 |
| JP | 2004-154986 A | 6/2004 |
| JP | 2005-131875 A | 5/2005 |
| JP | 2007-118512 A | 5/2007 |

OTHER PUBLICATIONS

Japan Patent Office, Office Action in counterpart Patent Application No. JP 2008-301868, mailed on Aug. 3, 2010.

* cited by examiner

*Primary Examiner* — Jason Uhlenhake
(74) *Attorney, Agent, or Firm* — Baker Botts L.L.P.

(57) ABSTRACT

An FPC connected to a piezoelectric actuator has a board and two driver ICs mounted on the board. The board is provided with two wires for transmitting two kinds of mode selection signals respectively corresponding to two kinds of driving modes and with a selection pad selecting one from the two kinds of mode selection signals transmitted through the two wires and then outputting the selected signal to each driver IC.

12 Claims, 16 Drawing Sheets

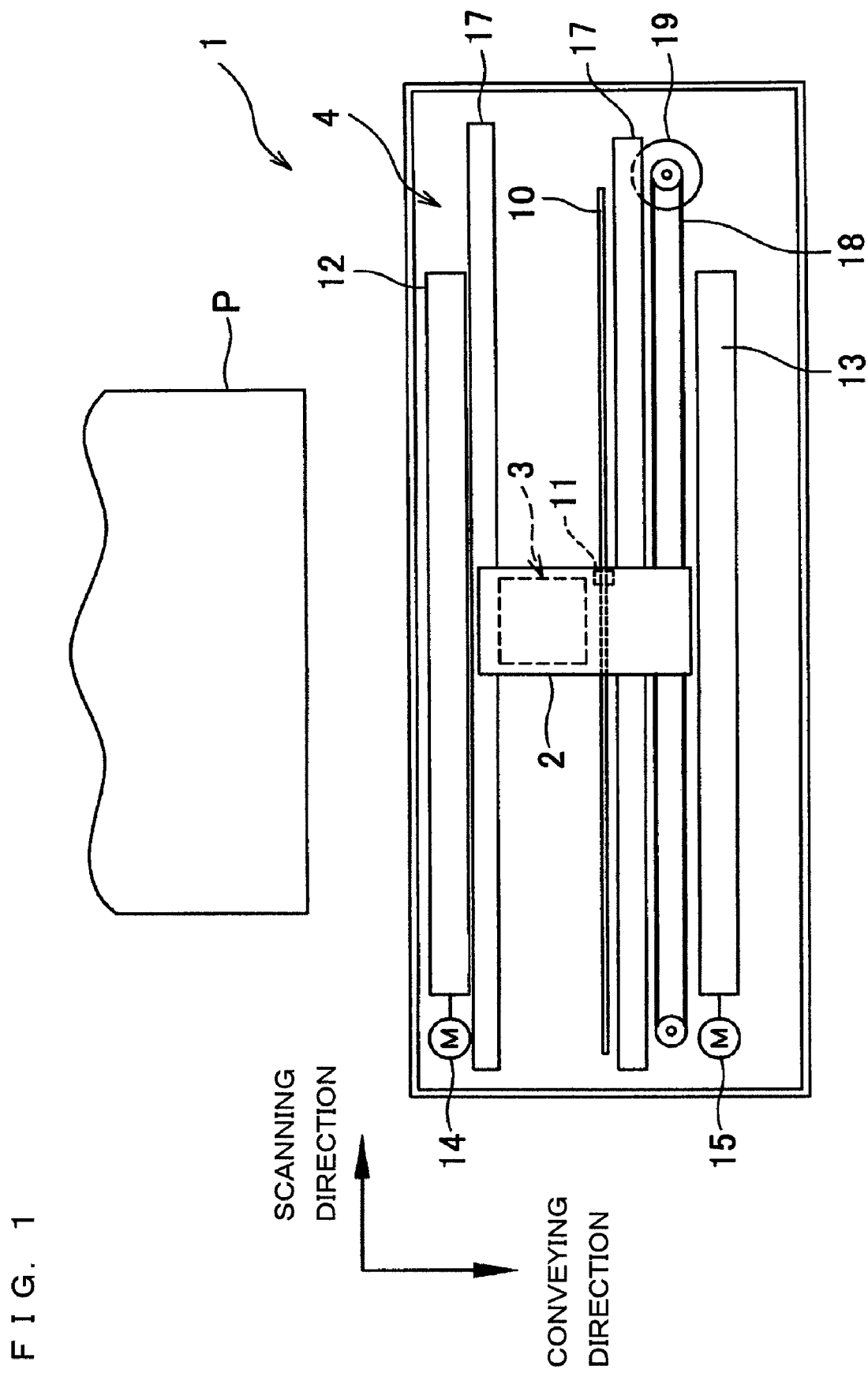

F I G. 10
(a) ODD NUMBER ROW
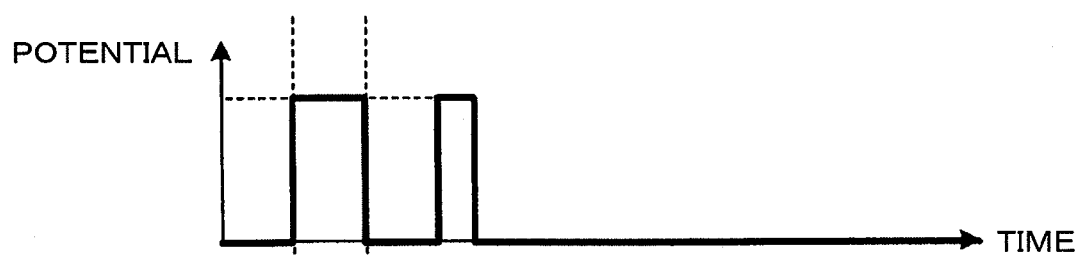
(b) EVEN NUMBER ROW
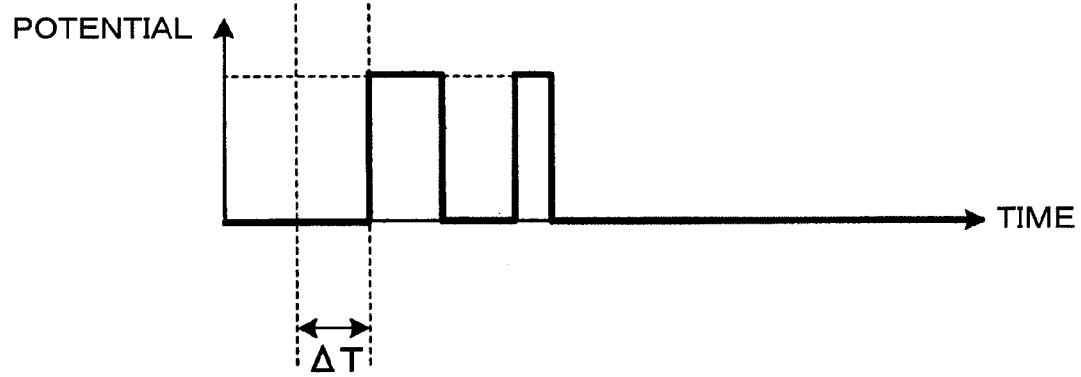

F I G. 1 2
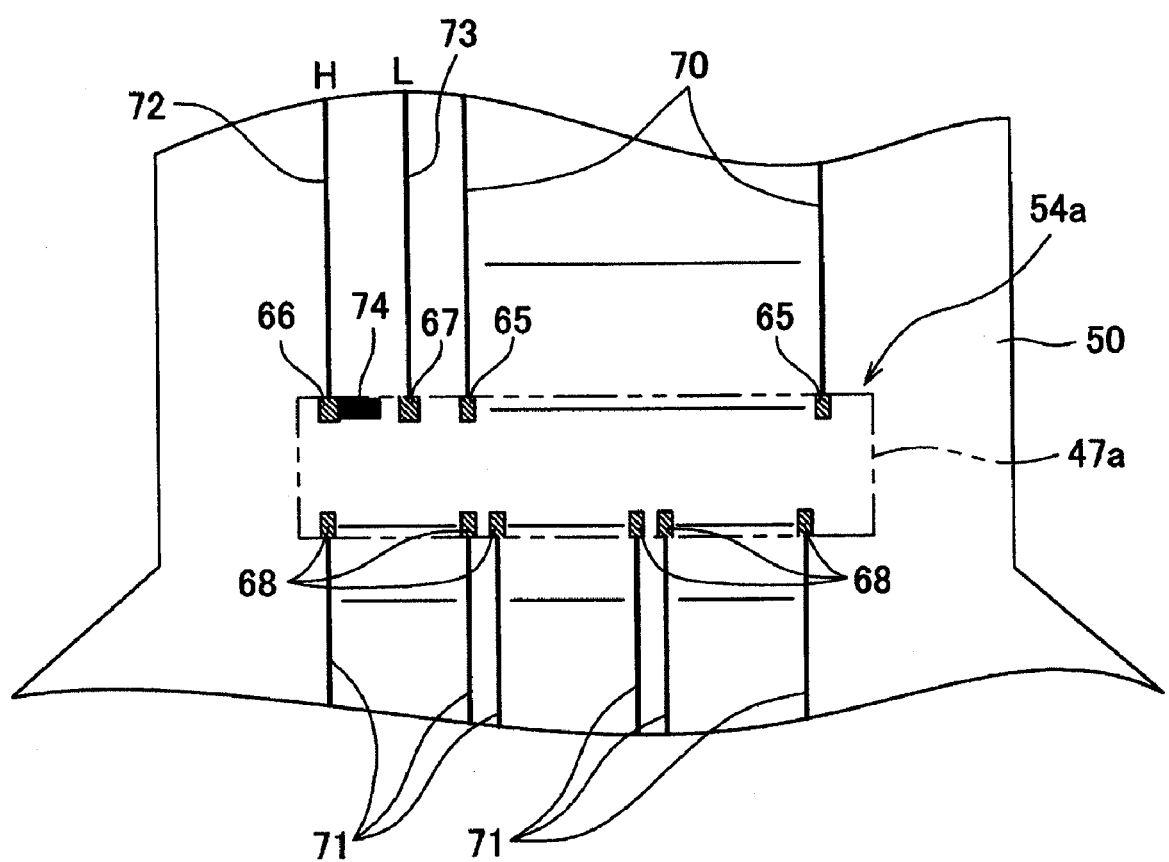

FIG. 16

| OUTPUT TERMINAL GROUP | WAVEFORM DATA GROUP | |
|---|---|---|
| | W1 | W2 |
| FIRST | EVEN NUMBER ROW | EVEN NUMBER ROW |
| SECOND | EVEN NUMBER ROW | ODD NUMBER ROW |
| THIRD | ODD NUMBER ROW | ODD NUMBER ROW |

WIRING BOARD

CROSS-REFERENCE TO RELATED APPLICATIONS

This non-provisional application claims priority under 35 U.S.C. §119(a) on Patent Application No. 2008-301868 filed in Japan on Nov. 27, 2008, the entire contents of which are hereby incorporated by reference.

TECHNICAL FIELD

The present invention relates to a wiring board on which ICs (Integrated Circuits) are mounted.

BACKGROUND

In the prior art, in a wiring board connected to various kinds of apparatuses so that, for example, signals are transmitted or electric power is supplied, a plurality of ICs for controlling the apparatuses are mounted on the board. For example, in the field of recording apparatuses each comprising a large number of recording elements for recording an image or the like onto a recording medium such as printing paper, in order to meet the demand of high-speed printing and high-resolution printing, a recent trend is present that the number of recording elements increases. Nevertheless, when a large number of recording elements are to be driven and controlled by a single IC, the arrangement of wires from the IC to the recording elements becomes complicated. Further, a limitation is present also from the perspective of the processing capability or the like of the IC itself. In such a situation, a solution may be the use of a wiring board on which a plurality of ICs are mounted.

An ink-jet type recording head described in Japanese Patent Application Laid-Open No. 2004-154986 has: a nozzle plate provided with a plurality of nozzles arranged in two rows; a passage formation board on which a plurality of pressure chambers respectively in communication with the plurality of nozzles are formed; and a plurality of piezoelectric elements arranged on the passage formation board in two rows corresponding to the plurality of nozzles and each applying a pressure to the corresponding pressure chambers. Further, in such an ink-jet type recording head, a sealing board is attached to the passage formation board, and then on the sealing board, two drive ICs for driving the piezoelectric elements are provided independently for individual piezoelectric element rows.

SUMMARY

Meanwhile, when predetermined objects to be driven are to be driven and controlled by a plurality of ICs, in some cases, the plurality of ICs need perform plural kinds of processes whose contents are different from each other. For example, in the ink-jet type recording head described in Japanese Patent Application Laid-Open No. 2004-154986, in order that mutual propagation (cross talk) of vibrations is avoided between the two adjacent pressure chamber rows (between the two nozzle rows), ejection timing is shifted to each other, or alternatively the magnitude of the pressure applied to the ink is varied in order that the droplet diameter or the ink type is varied between the two nozzle rows. In such a case, the two drive ICs on the board output driving signals (driving pulse signals) having different waveforms or voltage levels from each other, respectively to the two piezoelectric element rows.

As such, in a case that a plurality of ICs need perform plural kinds of processes whose contents are different from each other, the specifications (circuit configurations) of all the plurality of ICs may be different from each other in accordance with the contents of processes. Nevertheless, the use of dedicated ICs each specialized to each of the plural kinds of contents of processes is disadvantageous from the perspective of the cost. Thus, it is preferable to employ a plurality of ICs having the same circuit configuration. In this approach, a technique is necessary for causing each IC to recognize the contents of process to be executed by the IC.

An object of the present invention is to provide a wiring board capable of causing each of a plurality of ICs mounted on the board to recognize a process mode to be executed.

The wiring board according to a first aspect is a wiring board comprising: a board; a plurality of ICs mounted on the board; and a signal selection part provided on the board and outputting, to each IC, one selection signal among a plurality of selection signals respectively corresponding to a plurality of processes, wherein each IC has a processing part performing a process corresponding to the selection signal inputted from the signal selection part.

In the first aspect, the signal selection part provided on the board selects one from the plurality of selection signals and then outputs the selected signal to each IC. The processing part of each IC executes a process corresponding to the inputted selection signal.

According to such a configuration, when each IC having a processing part selectively performing plural kinds of processes is merely mounted on a board, a predetermined selection signal selected by a signal selection part provided on the board is inputted to the IC so that the processing part of each IC recognizes the process to be executed. This allows the use of a plurality of ICs having the same circuit configuration, and avoids the necessity of ICs each having a dedicated circuit configuration corresponding to each process to be executed. Further, a signal selection part selecting a process is provided on the board side. Thus, on the IC side, the necessity of a special circuit selecting a process to be executed by the processing part is avoided. Further, also in the transmission-side circuit transmitting a signal to each IC via the wiring board, the circuit need not selectively transmit a particular selection signal to each IC, and may transmit all selection signals to each IC. This simplifies the circuit configuration in both of the IC-side circuit and the transmission-side circuit, and hence reduces the cost.

According to the first aspect, when each IC having a processing part selectively performing plural kinds of processes is merely mounted at a predetermined position on a board, a predetermined selection signal selected by a signal selection part provided at the mounting position is inputted to the IC so that the processing part of each IC recognizes the process to be executed. This allows the use of a plurality of ICs having the same circuit configuration capable of executing plural kinds of processes, and avoids the necessity of ICs each having a dedicated circuit configuration corresponding to each process to be executed. Further, a signal selection part selecting a process is provided on the board side. Thus, on the IC side, the necessity of a special circuit selecting a process to be executed by the processing part is avoided. Further, also in the transmission-side circuit transmitting a signal to each IC via the wiring board, the circuit need not selectively transmit a particular selection signal to each IC, and may transmit all selection signals to each IC. This simplifies the circuit configuration in both of the IC-side circuit and the transmission-side circuit, and hence reduces the cost.

The above and further objects and features will more fully be apparent from the following detailed description with accompanying drawings.

BRIEF DESCRIPTION OF THE SEVERAL VIEWS OF THE DRAWINGS

FIG. 1 is a schematic plan view of an ink jet printer according to an embodiment.

FIG. 10 is a diagram showing waveforms of a driving signal provided from the driver IC when a small droplet size (S1) is selected in a case (a) that nozzles to be driven belong to an odd-number-th nozzle row and in a case (b) that nozzles to be driven belong to an even-number-th nozzle row.

FIG. 12 is a plan view showing one mounting part on a board.

FIG. 16 is a diagram showing relation between three output terminal groups of the driver IC and the type of the driving waveform contained in two waveform data groups W1 and W2 inputted to the multiplexer.

DETAILED DESCRIPTION

Figure 2:
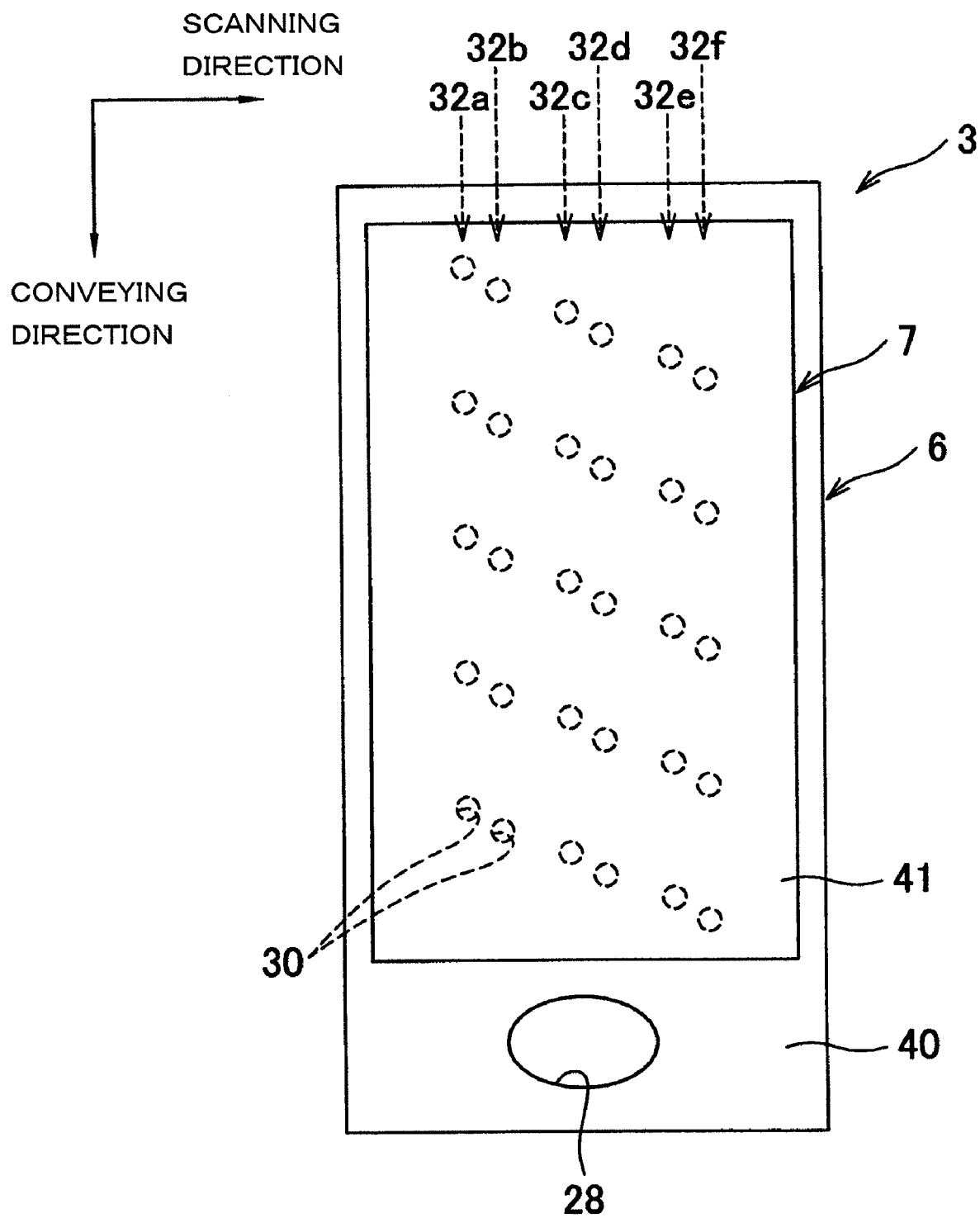
FIG. 2 is a plan view of an ink jet head.

Embodiments are described below. The present embodiment gives an example of an ink jet printer provided with an ink jet head ejecting ink droplets onto recording paper.

First, a schematic configuration of an ink jet printer 1 according to the present embodiment is described below. FIG. 1 is a schematic plan view of an ink jet printer according to the present embodiment. As shown in FIG. 1, the printer 1 includes: a carriage 2 constructed so as to reciprocally move in a predetermined scanning direction (the right and left directions in FIG. 1); an ink jet head 3 mounted on the carriage 2; and a conveyance mechanism 4 conveying recording paper P in a conveying direction perpendicular to the scanning direction.

The carriage 2 is constructed so as to reciprocally move along two guide shafts 17 extending in parallel to the scanning direction (the right and left directions in FIG. 1). Further, an endless belt 18 is linked to the carriage 2. Thus, when the endless belt 18 is driven to run by a carriage drive motor 19, the carriage 2 moves in the scanning direction in association with the running of the endless belt 18. Here, in the printer 1, a linear, encoder 10 is provided that has a large number of light-transmitting parts (slits) arranged with intervals in the scanning direction. On the other hand, the carriage 2 is provided with a transmission type photosensor 11 having a light emitting element and a light receiving element. Thus, on the basis of the number of counts (the number of times of detection) of the light-transmitting parts of the linear encoder 10 detected by the photosensor 11 during the movement of the carriage 2, the printer 1 recognizes the current position in the scanning direction of the carriage 2.

The ink jet head 3 is mounted on the carriage 2. The ink jet head 3 has a large number of nozzles 30 (see FIGS. 2 to 5) on the lower surface (the surface opposite to the surface shown in FIG. 1) thereof. The ink jet head 3 is constructed so as to eject ink supplied from an ink cartridge (not shown) through the large number of nozzles 30 onto the recording paper P conveyed downward (in the conveying direction) in FIG. 1 by the conveyance mechanism 4.

The conveyance mechanism 4 has: a paper feed roller 12 arranged in the upstream of the ink jet head 3 in the conveying direction; and a paper discharge roller 13 arranged in the downstream of the ink jet head 3 in the conveying direction. The paper feed roller 12 and the paper discharge roller 13 are driven to revolve by a paper feed motor 14 and a paper discharge motor 15, respectively. Then, the conveyance mechanism 4 causes the paper feed roller 12 to convey the recording paper P from the upward in FIG. 1 toward the ink jet head 3. Then, the recording paper P on which images, characters, and the like have been recorded by the ink jet head 3 is discharged downward in FIG. 1 by the paper discharge roller 13.

Figure 3:
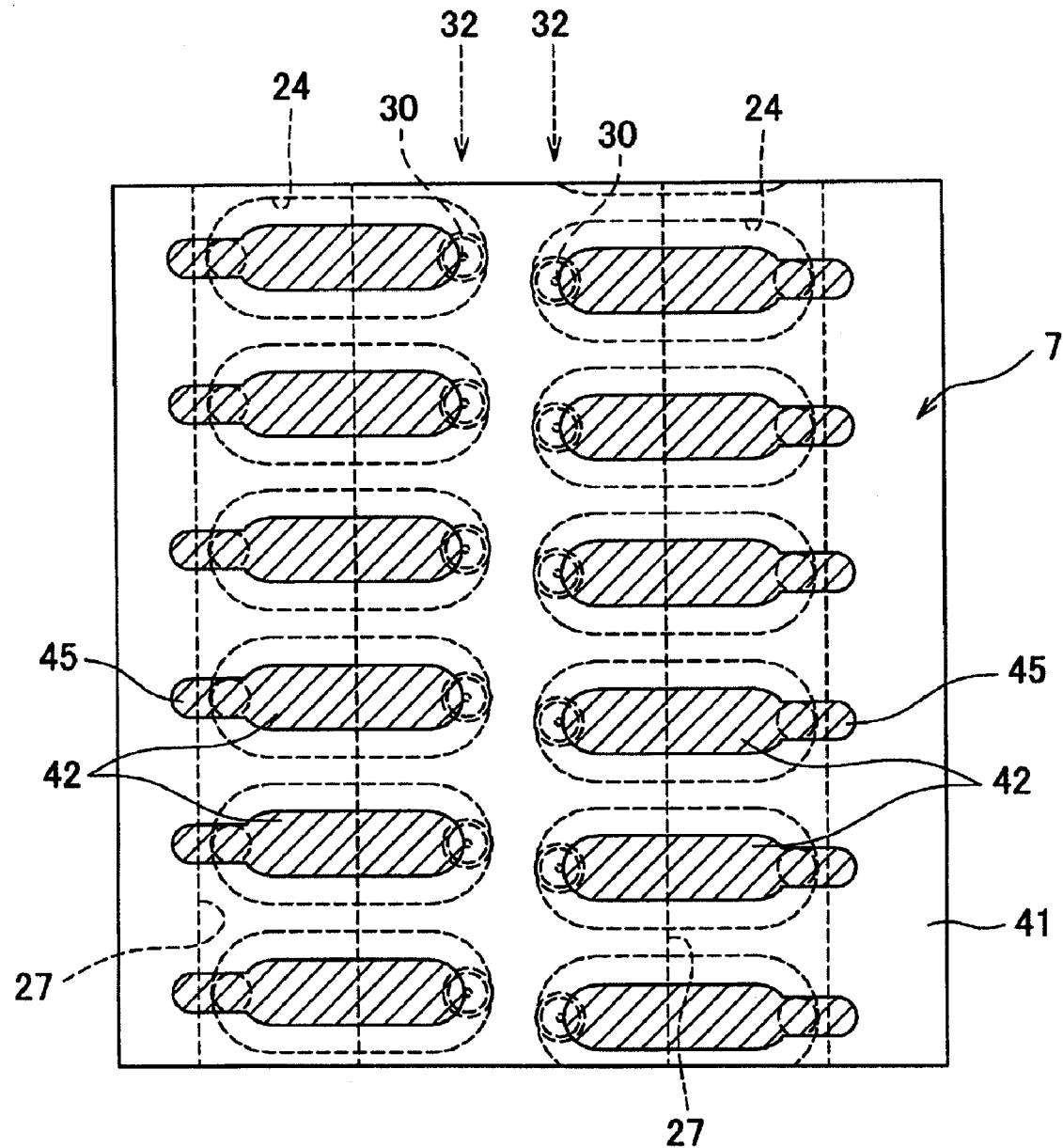
FIG. 3 is an enlarged view of a part of FIG. 2.
Figure 4:
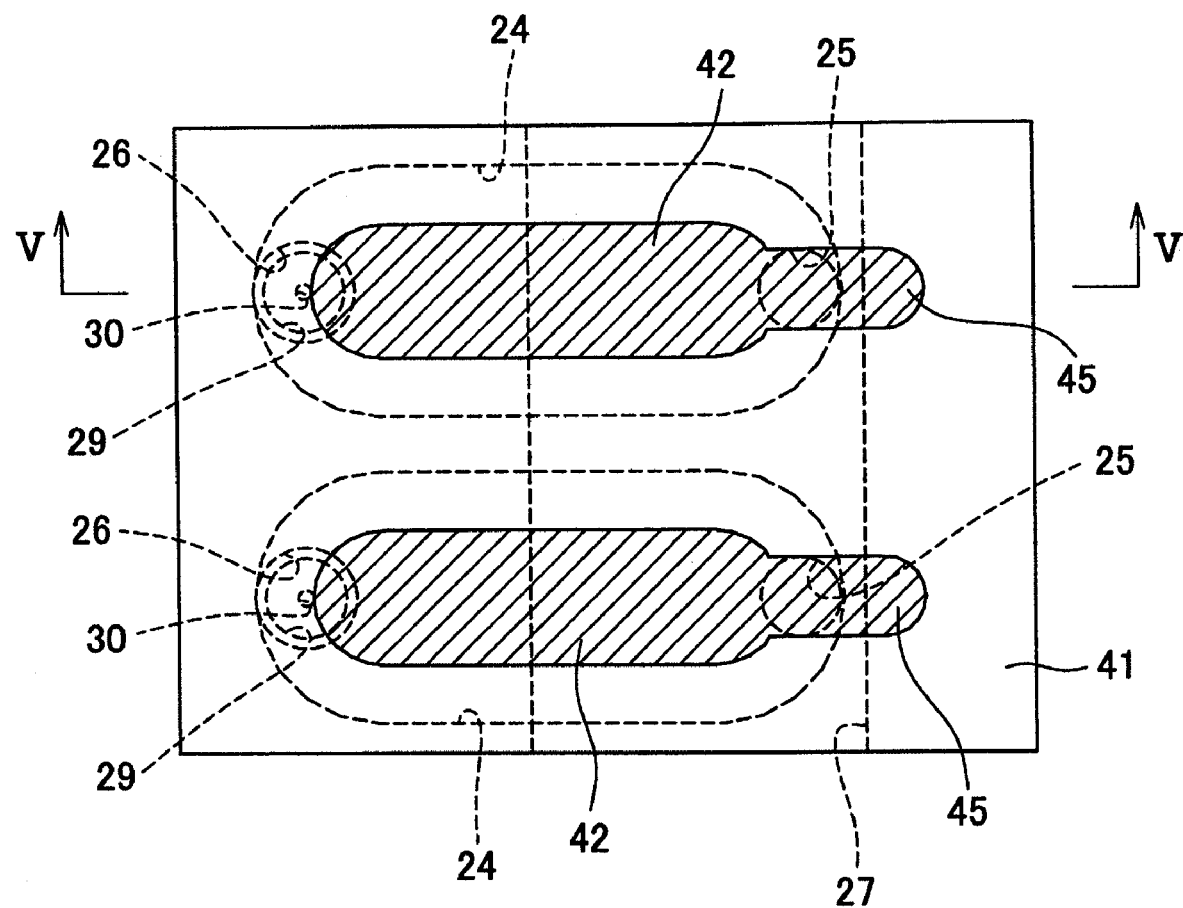
FIG. 4 is an enlarged view of a part of FIG. 3.
Figure 5:
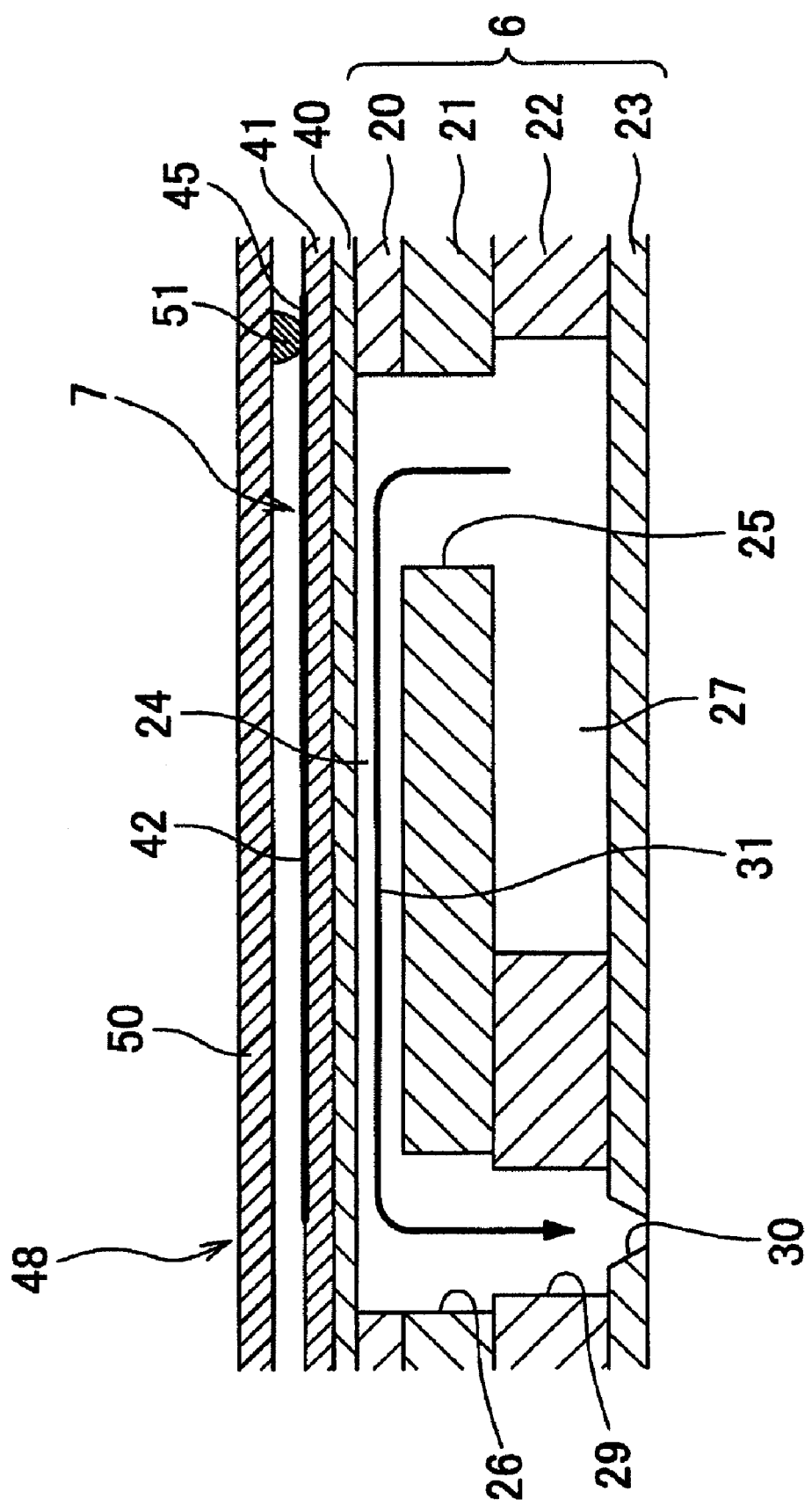
FIG. 5 is a sectional view taken along line V-V in FIG. 4.

Next, the ink jet head 3 is described below. FIG. 2 is a plan view of the ink jet head. FIG. 3 is an enlarged view of a part of FIG. 2. FIG. 4 is a further enlarged view of FIG. 3. FIG. 5 is a sectional view taken along line V-V in FIG. 4. Here, in FIG. 2, for simplicity of the drawing, a large part of the nozzles 30 arranged in the conveying direction are omitted. Further, in FIG. 5, a flexible printed circuit board (FPC) 48 is shown together that is joined to the ink jet head 3 in a manner covering the upper face.

As shown in FIGS. 2 to 5, the ink jet head 3 has: a passage unit 6 in which ink passages each including a nozzle 30 and a pressure chamber 24 are formed; and a piezoelectric actuator 7 applying a pressure to the ink in the pressure chambers 24.

First, the passage unit 6 is described below. As shown in FIG. 5, the passage unit 6 has a cavity plate 20, a base plate 21, a manifold plate 22, and a nozzle plate 23. These four plates 20 to 23 are stacked and joined. Among the four plates, each of the cavity plate 20, the base plate 21, and the manifold plate 22 is, in plan view, an approximately rectangular plate composed of a metallic material such as stainless steel. Thus, in the three plates 20 to 22, the ink passages each constructed from a later-described manifold 27, the pressure chamber 24, and the like are easily formed by etching. Further, the nozzle plate 23 is formed, for example, from a synthetic resin polymer material such as polyimide, and then joined onto the lower surface of the manifold plate 22 with an adhesive. Alternatively, similarly to the three other plates 20 to 22, the nozzle plate 23 may also be formed from a metallic material such as stainless steel.

As shown in FIG. 5, the nozzle plate 23 serving as the lowermost layer among the four plates 20 to 23 is provided with the plurality of nozzles 30. As shown in FIGS. 2 and 3, the plurality of nozzles 30 are arranged in a matrix form. Specifically, the plurality of nozzles 30 are arranged in a staggered layout two-rows by two-rows in the conveying direction. Further, these two nozzle rows themselves are also arranged in a staggered layout. Then, six nozzle rows 32 (32a to 32f) in total are arranged in the scanning direction perpendicular to the conveying direction.

In the cavity plate 20 serving as the uppermost layer, a plurality of pressure chambers 24 arranged on the plane are formed by through holes penetrating the plate 20. As shown in FIG. 5, the plurality of pressure chambers 24 are covered by a later-described diaphragm 40 and the base plate 21 respectively from the up and the down sides. Each pressure chamber 24 is formed in an approximately elliptical shape elongated in the scanning direction (the right and left directions in FIG. 2) in plan view. Further, as shown in FIG. 3, the plurality of pressure chambers 24 are arranged in the conveying direction (the up and down directions in FIG. 2) in correspondence to the plurality of nozzles 30, respectively.

As shown in FIGS. 4 and 5, in the base plate 21, communicating holes 25 and 26 are formed respectively at positions overlapping with the two ends of the pressure chamber 24 in the longitudinal direction in plan view. Further, in the manifold plate 22, a plurality of manifolds 27 are formed that extend in the conveying direction so as to overlap respectively with the parts on the communicating hole 25 side of the pressure chambers 24 arranged in a line, in plan view. The plurality of manifolds 27 are in communication with an ink supply opening 28 (see FIG. 2) provided in the diaphragm 40 of the piezoelectric actuator 7 joined to the cavity plate 20. Then, ink is supplied from an ink tank (not shown) through the ink supply opening 28 to the manifolds 27. Further, in the manifold plate 22, a plurality of communicating holes 29 for communication respectively between the plurality of communicating holes 26 and the plurality of nozzles 30 are also formed at positions overlapping with an opposite end part of the plurality of pressure chambers 24 relative to the manifold 27 in plan view.

As shown in FIG. 5, each of the manifolds 27 is in communication with the pressure chamber 24 via the communicating hole 25. Further, the pressure chamber 24 is in communication with the nozzle 30 via the communicating holes 26 and 29. As such, in the inside of the passage unit 6, a plurality of individual ink passages 31 are provided that lead from the manifold 27 through the pressure chambers 24 to the nozzles 30.

Next, the piezoelectric actuator 7 is described below. As shown in FIGS. 2 to 5, the piezoelectric actuator 7 has: the diaphragm 40 arranged on the upper surface of the passage unit 6 (the cavity plate 20) so as to cover the plurality of pressure chambers 24; a piezoelectric layer 41 arranged on the upper surface of the diaphragm 40 so as to be oppose to the plurality of pressure chambers 24; and a plurality of individual electrodes 42 arranged on the upper surface of the piezoelectric layer 41 so as to be opposite respectively to the plurality of pressure chambers 24.

The diaphragm 40 is a metal plate having an approximately rectangular shape in plan view, and is formed from an iron-based alloy such as stainless steel, a copper-based alloy, a nickel-based alloy, a titanium-based alloy, or the like. The diaphragm 40 is joined to the upper surface of the cavity plate 20 so as to cover the plurality of pressure chambers 24. Further, the diaphragm 40 having electrical conductivity is arranged on the lower face side of the piezoelectric layer 41, so as to serve as a common electrode for generating, in the piezoelectric layer 41, an electric field in the thickness direction between itself and the plurality of individual electrodes 42. The diaphragm 40 serving as the common electrode is connected to the ground of the drivers IC 47 (see FIGS. 6 and 7) mounted on the FPC 48, and is always maintained at the ground potential.

The piezoelectric layer 41 is formed from a piezoelectric material composed mainly of lead zirconate titanate (PZT) which is a ferroelectric material formed as a solid solution body between lead titanate and lead zirconate. As shown in FIGS. 3 and 4, the piezoelectric layer 41 extends on the upper surface of the diaphragm 40 so as to cover the plurality of pressure chambers 24. Further, the piezoelectric layer 41 has polarization in the thickness direction at least in the regions opposite to the pressure chambers 24.

The plurality of individual electrodes 42 are arranged on the upper surface of the piezoelectric layer 41 so as to be opposite respectively to the plurality of pressure chambers 24. Each individual electrode 42 has an approximately elliptical planar shape somewhat smaller than each pressure chamber 24, and is arranged opposite to the center part of the pressure chamber 24. Further, a plurality of contact parts 45 extend from the end parts of the plurality of individual electrodes 42 in a longitudinal direction of the individual electrodes 42. As shown in FIG. 5, the plurality of contact parts 45 are connected respectively to a plurality of connection terminals 51 provided on the FPC 48.

Figure 6:
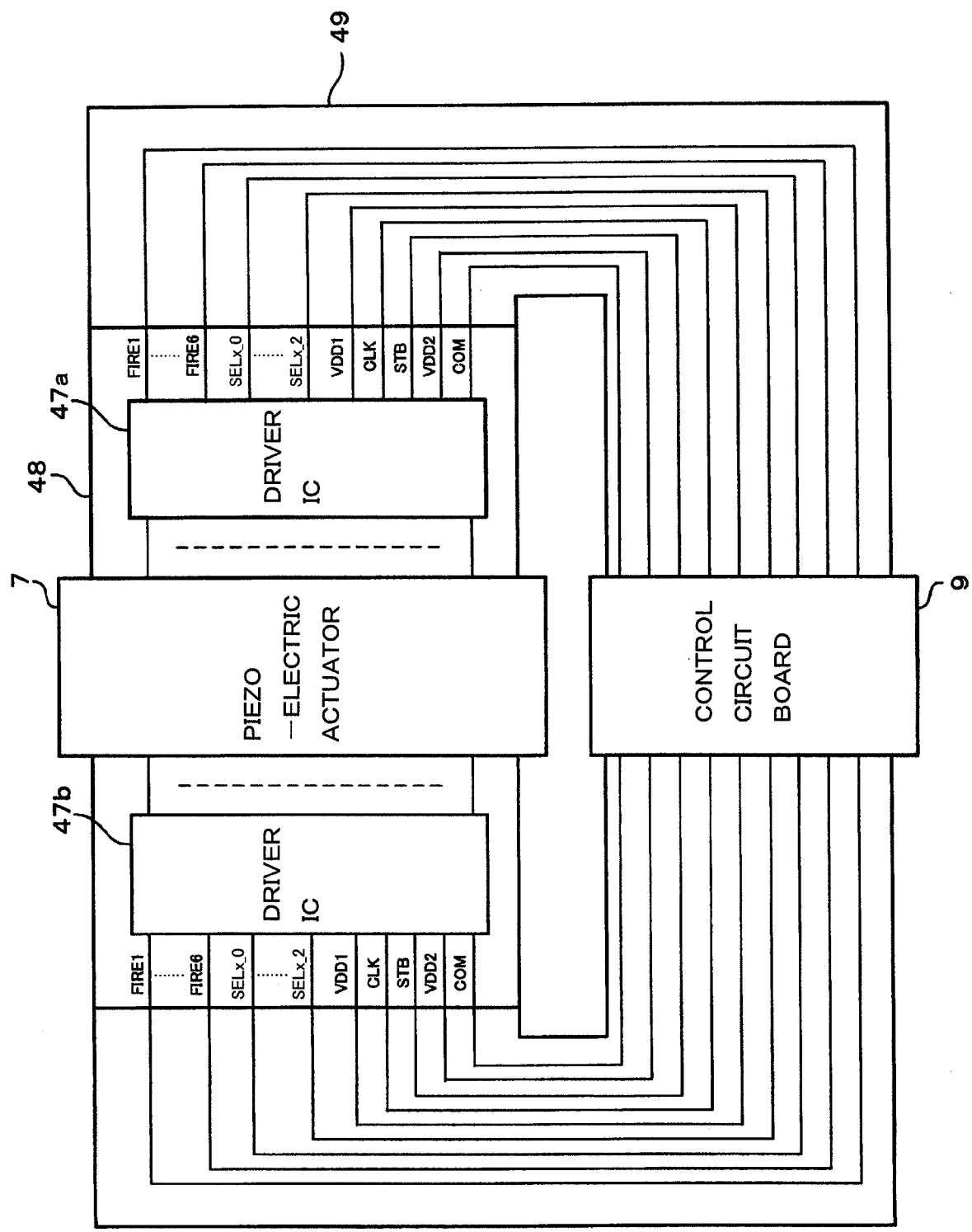
FIG. 6 is a diagram schematically showing a connection configuration between a piezoelectric actuator of the ink jet head and a control circuit board of the printer.

FIG. 6 is a diagram schematically showing a connection configuration between the piezoelectric actuator 7 of the ink jet head 3 and a control circuit board of the printer 1. As shown in FIG. 6, the plurality of driver ICs 47 driving the piezoelectric actuator 7 are mounted on the FPC 48 connected to the piezoelectric actuator 7. Further, the FPC 48 is connected also to a flexible flat cable (FFC) 49. Then, the FFC 49 is connected to the control circuit board 9.

On the basis of a signal inputted from the control circuit board 9 through the FFC 49, the plurality of driver ICs 47 selectively apply one of a predetermined drive potential and the ground potential through the wire on the FPC 48 to the plurality of individual electrodes 42 of the piezoelectric actuator 7. Here, as described later in detail, the plurality of driver ICs 47 consists of two driver ICs 47a and 47b. Then, each of the driver ICs 47a and 47b applies a potential to a half of the individual electrodes 42 assigned in advance among all of the individual electrodes 42 of the piezoelectric actuator 7.

Next, the operation of the piezoelectric actuator 7 at the time of ink ejection is described below. When a predetermined drive potential is applied from one driver IC 47 to a certain individual electrode 42, a potential difference arises between the individual electrode 42 to which the driving potential is applied and the diaphragm 40 serving as the common electrode maintained at the ground potential. Thus, as shown in FIG. 5, an electric field in the thickness direction acts on the piezoelectric layer 41 located between the individual electrode 42 and the diaphragm 40. The direction of the electric field is parallel to the polarization direction of the piezoelectric layer 41. Thus, the region of the piezoelectric layer 41 opposite to the individual electrode 42 contracts in the plane direction perpendicular to the thickness direction. Here, the diaphragm 40 under the piezoelectric layer 41 is fixed to the cavity plate 20. Thus, in association with the contraction of the piezoelectric layer 41 in the plane direction, deformation (unimorph deformation) occurs such that the part covering the pressure chamber 24 of the diaphragm 40 becomes convex toward the pressure chamber 24. At this time, the volume of the pressure chamber 24 decreases, and hence the pressure in the pressure chamber 24 rises. As a result, ink is ejected through the nozzle 30 in communication with the pressure chamber 24.

Figure 7:
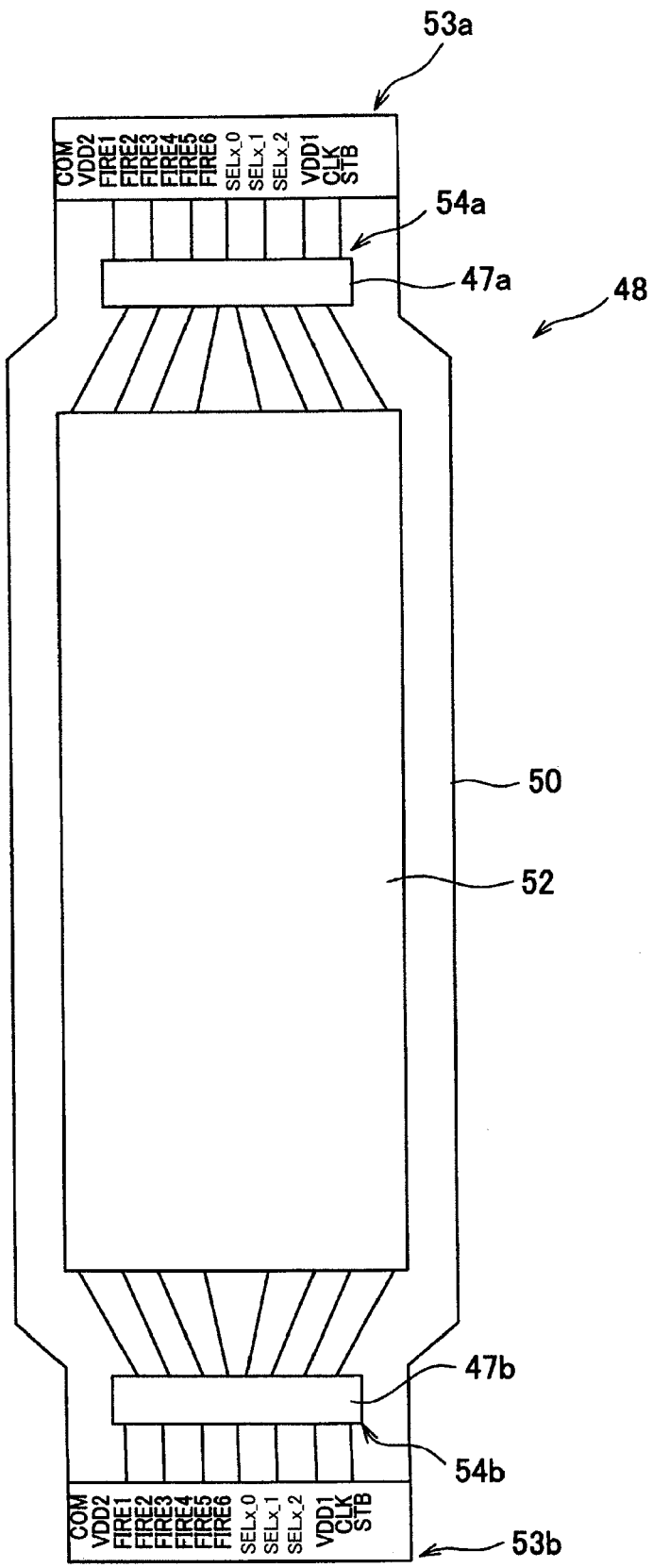
FIG. 7 is a plan view of an FPC.

Next, the FPC 48 connected to the piezoelectric actuator 7 is described below in further detail. FIG. 7 is a detailed plan view of the FPC 48 schematically shown in FIG. 6. As shown in FIGS. 6 and 7, the FPC 48 has: a board 50 having flexibility formed from a soft synthetic resin material such as polyimide; the two driver ICs 47 (47a and 47b) mounted on the board 50; and a large number of wires connected to the two driver ICs 47.

As shown in FIG. 7, the board 50 has a shape elongated in one direction. The center part in the longitudinal direction of the board 50 serves as a terminal arrangement region 52 where the plurality of connection terminals 51 (see FIG. 5) to be connected respectively to the plurality of contact parts 45 of the piezoelectric actuator 7 are arranged (illustration of the connection terminals 51 is omitted in FIG. 7). Further, the two driver ICs 47a and 47b are arranged respectively at positions (the mounting parts 54a and 54b) symmetric to each other with respect to the terminal arrangement region 52 in the longitudinal direction of the board 50. The two driver ICs 47 are connected respectively to the plurality of connection terminals 51 arranged in the terminal arrangement region 52 through the plurality of wires. Further, the both ends in the longitudinal direction of the board 50 serve as input parts 53 (53a and 53b) connected respectively to the FFC 49 (see FIG. 6). In each input part 53, a large number of input terminals through which various kinds of signals are inputted to the driver IC 47 are arranged.

Here, additional description is given below for the various kinds of signals inputted through the input part 53 of the FPC 48 to the driver IC 47. As shown in FIGS. 6 and 7, VDD1 indicates a signal having a voltage level of a low-voltage power supply (e.g., 3.3 V) for driving the driver IC 47. VDD2 indicates a signal having a voltage level of a high-voltage power supply (e.g., 20 V) for driving the piezoelectric actuator 7. COM indicates a signal having the ground level of the ground for the common electrode (the diaphragm 40 in the present embodiment). CLK indicates a clock signal for data transfer from the control circuit board 9 to the driver IC 47. STB indicates a strobe control signal used for controlling the driver IC 47.

Further, in the ink jet printer 1 of the present embodiment, for the purpose of realizing multi-gradation representation and high-quality image printing, the size (droplet volume) of a droplet to be ejected from each nozzle 30 is selected from five available sizes. That is, for each nozzle 30, one ejection mode is selected from a total of six ejection modes consisting of a mode that a droplet is not ejected and five modes each having a different droplet volume from each other.

Thus, as shown in FIGS. 6 and 7, six kinds of driving waveform data (FIRE1 to FIRE6) respectively corresponding to the six ejection modes described above are inputted from the control circuit board 9 to each driver IC 47. At the same time, 3-bit selection data (SELx_0 to _2: x indicates an output terminal number of the driver IC 47) for specifying one of the six ejection modes at the ejection timing of each nozzle 30 are serially inputted to the driver IC 47 from the control circuit board 9. Then, for each nozzle 30, the driver IC 47 generates a driving signal (a driving pulse) having a driving waveform corresponding to the ejection mode specified by the selection data, and then provides the generated driving signal to the contact part 45 (the individual electrode 42) of the piezoelectric actuator 7 corresponding to each nozzle 30.

Figure 8:
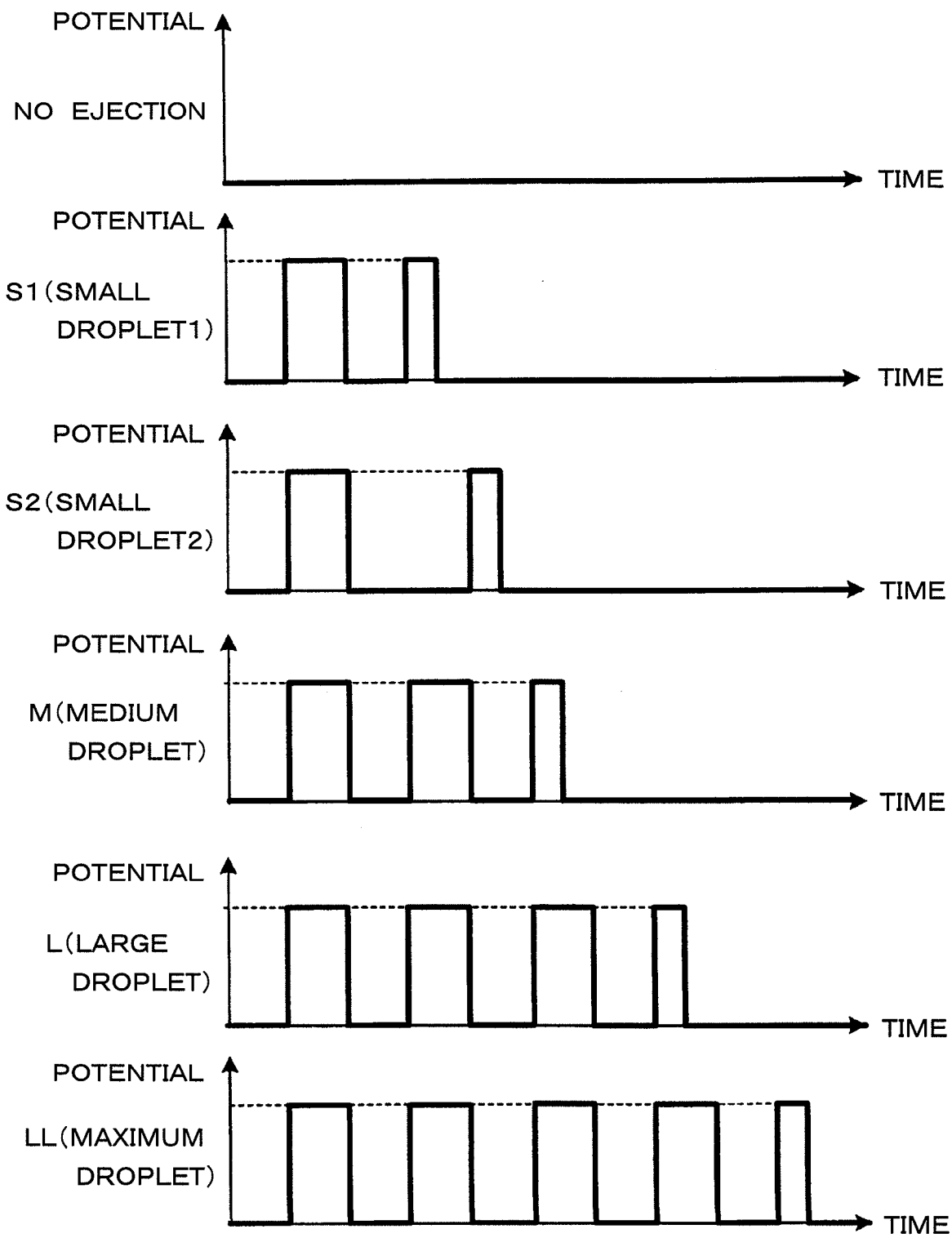
FIG. 8 is a diagram showing six kinds of driving waveforms corresponding to six ejection modes.

Additional description is given below for the waveforms (driving waveforms) of driving signals corresponding respectively to the six ejection modes. As described above, Among the six ejection modes, in the five ejection modes other than the mode that a droplet is not ejected, the ejected droplet has a different volume from each other. Further, the droplet amount (droplet volume) ejected from each nozzle 30 is proportional to the magnitude of the pressure applied to the ink in the pressure chamber 24. Thus, in order that a mutually different pressure is applied to the ink in each pressure chamber 24, the driver IC 47 provides a driving signal having a mutually different waveform to each individual electrode 42 of the piezoelectric actuator 7. By virtue of this, the potential of each individual electrode 42 is switched between the drive potential (V0) and the ground potential at an appropriate timing so that droplets having mutually different volumes are selectively ejected from the nozzles 30. FIG. 8 shows six kinds of driving waveforms corresponding to the six ejection modes.

FIG. 8 shows six kinds of driving waveforms corresponding respectively to the six ejection modes consisting of no ejection, S1 (small droplet size 1), S2 (small droplet size 2), M (medium droplet size), L (large droplet size), and LL (maximum droplet size). Each driver IC 47 selects one from the six kinds of driving waveforms, then generates a driving signal having the selected driving waveform, and then applies the generated signal onto the individual electrode 42 of the piezoelectric actuator 7.

As shown in FIGS. 6 and 7, in the present embodiment, the two driver ICs 47a and 47b are mounted on the board 50 of the FPC 48. Then, the two driver ICs 47a and 47b drive and control the piezoelectric actuator 7 (apply a potential onto the individual electrodes 42 (apply a driving pulse)). More specific description is given below. The plurality of nozzles 30 of the ink jet head 3 consist of two groups. The configuration for ejecting droplets through the plurality of nozzles 30 (like the individual ink passages 31 including the pressure chambers 24 and the individual electrodes 42 of the piezoelectric actuator 7 and the like) also consists of two groups in correspondence to the two groups of the nozzles 30. Then, driving signals are supplied from the two driver ICs 47a and 47b, respectively to the two groups of the nozzles 30 (the two groups of the individual electrodes 42). Here, the configuration that includes a nozzle 30, an individual ink passage 31 including a pressure chamber 24 corresponding to the nozzle 30, and an individual electrode 42 corresponding to the pressure chamber 24 and the like and that causes the one nozzle 30 to eject a droplet corresponds to one recording element of the present invention. However, for simplicity in the following description, the "recording element" driven by the driver IC 47 is represented by the "nozzle 30".

Figure 9:
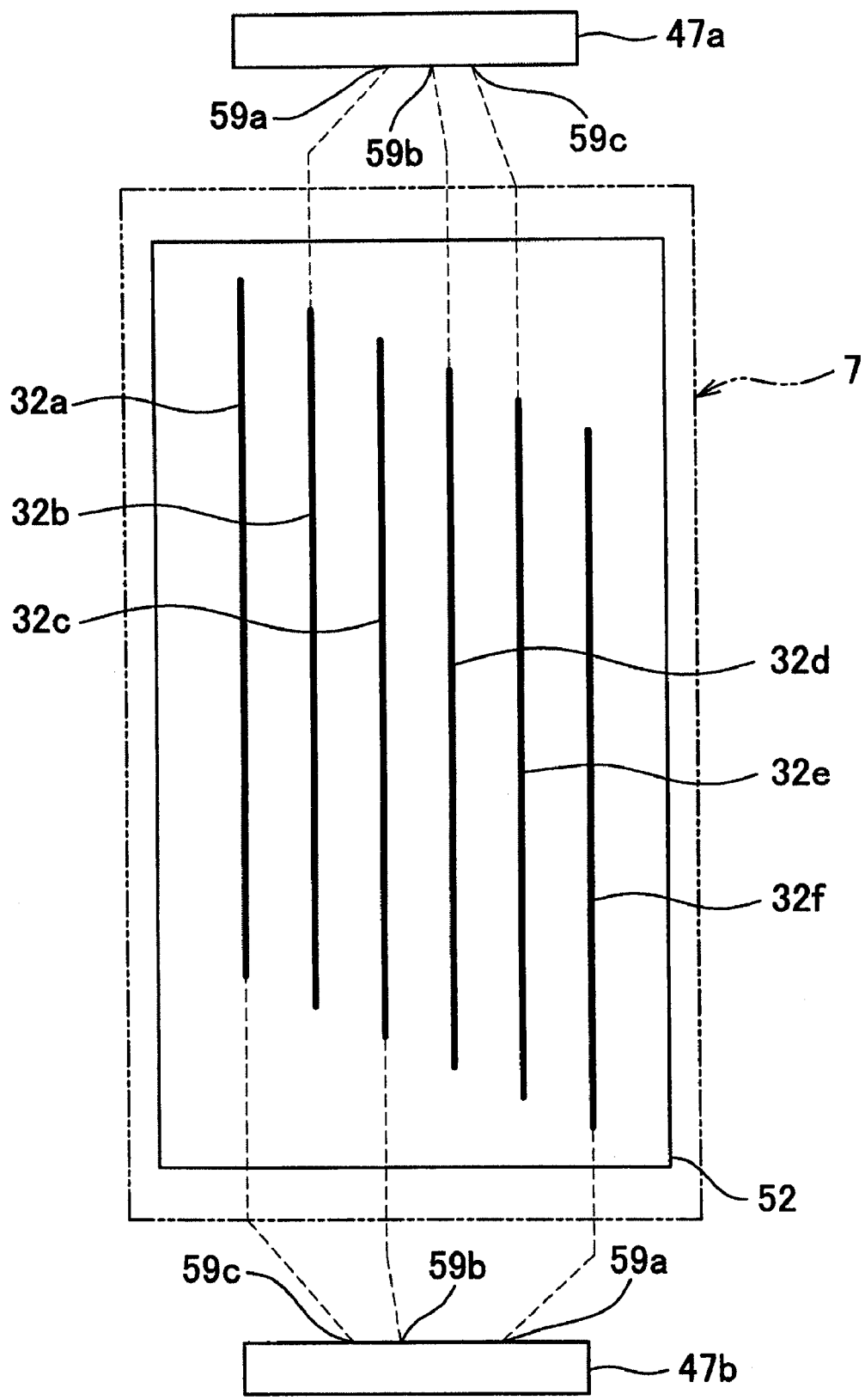
FIG. 9 is a diagram describing assignment of nozzles (recording elements) to two driver ICs.

FIG. 9 is a diagram describing the assignment of the nozzles 30 (recording elements) to the two driver ICs 47. Here, in FIG. 9, for simplicity of the drawing, each nozzle row 32 is indicated by one thick line. The dash-dotted lines joining the two driver ICs 47a and 47b to the six nozzle rows 32a to 32f indicate that the driver ICs 47 are electrically connected to the individual electrodes 42 for driving the nozzle rows 32 (that is, ejection from the nozzle rows 32 is controlled by the driver ICs 47).

As shown in FIG. 9, among the six nozzle rows 32 arrange in the right and left directions (in the scanning direction) in FIG. 9, the droplet ejection operation of the second nozzle row 32b, the fourth nozzle row 32d, and the fifth nozzle row 32e counted from the left in FIG. 9 is controlled by the driver IC 47a located above the terminal arrangement region 52 in FIG. 9. Further, the droplet ejection operation of the first nozzle row 32a, the third nozzle row 32c, and the sixth nozzle row 32f counted from the left in FIG. 9 is controlled by the driver IC 47b located below the terminal arrangement region 52 in the FIG. 9.

Meanwhile, in a case that the control of droplet ejection operation is the same for all the six nozzle rows 32 (that is, the same driving signal is outputted from the driver ICs 47 to the individual electrodes 42 to drive the nozzle rows 32), the circuit configuration for controlling the ejection need not be different from each other between the two driver ICs 47 regardless of which nozzle row 32 being to be driven by which of the two driver ICs 47. However, actually, in some cases, it is preferable that mutually different driving signals are used respectively for the nozzle rows 32 even when droplets of the same size are to be ejected (that is, the same driving waveform (FIG. 8) is selected). An example of such cases is described below.

In a case that a droplet is to be ejected simultaneously from each of two adjacent nozzle rows 32, when the pressure is applied to the ink at the same timing for the two pressure chamber rows corresponding to the two nozzle rows 32, a cross talk may arise that vibrations in the piezoelectric layer 41 and the diaphragm 40 propagate to each other. This may cause variation in the pressures applied to the ink in the two pressure chamber rows. Thus, in the present embodiment, in order to reduce the cross talk between adjacent nozzle rows 32, the pulse application timing of the driving signals to the individual electrodes 42 is shifted between two adjacent nozzle rows 32.

FIG. 10 is a diagram showing the waveforms of a driving signal provided when S1 (small droplet size) shown in FIG. 8 is selected. Part (a) shows the waveform of a case that the nozzle row 32 to which the nozzle 30 to be driven belongs is an odd-number-th (first, third, or fifth) nozzle row counted from the left in FIG. 9. Part (b) shows the waveform of a case that the nozzle row 32 is an even-number-th (second, fourth, or sixth) nozzle row. As shown in FIG. 10, in a case that the nozzle row 32 to be driven is the even-number-th row, the application timing of the pulse to the individual electrode 42 is delayed by $\Delta T$ in comparison with a case that the nozzle row 32 to be driven is the odd-number-th row.

As such, depending on the type (the odd-number-th or even-number-th) of the nozzle row 32 serving as a target of ejection control, the driving signal (the driving waveform) outputted from each output terminal of the driver IC 47 becomes different. That is, depending on the type of the nozzle row 32 serving as a driving target, the contents of process of generating a driving signal executed by each driver IC 47 become different. Nevertheless, the use of dedicated circuits each specialized to the contents of actual process, that is, the use of two driver ICs 47a and 47b having different circuit configurations from each other, is disadvantageous from the perspective of the cost. Thus, in the present embodiment, the two driver ICs 47a and 47b have the same specification capable of driving and controlling whichever of the two groups of nozzle rows 32 (the group of the second, the fourth, and the fifth nozzle rows 32 and the group of the first, the third, and the fourth nozzle rows 32). Then, a configuration capable of recognizing which of the two groups of nozzle rows 32 is to be driven and controlled is provided on the board 50 of the FPC 48.

Figure 11:
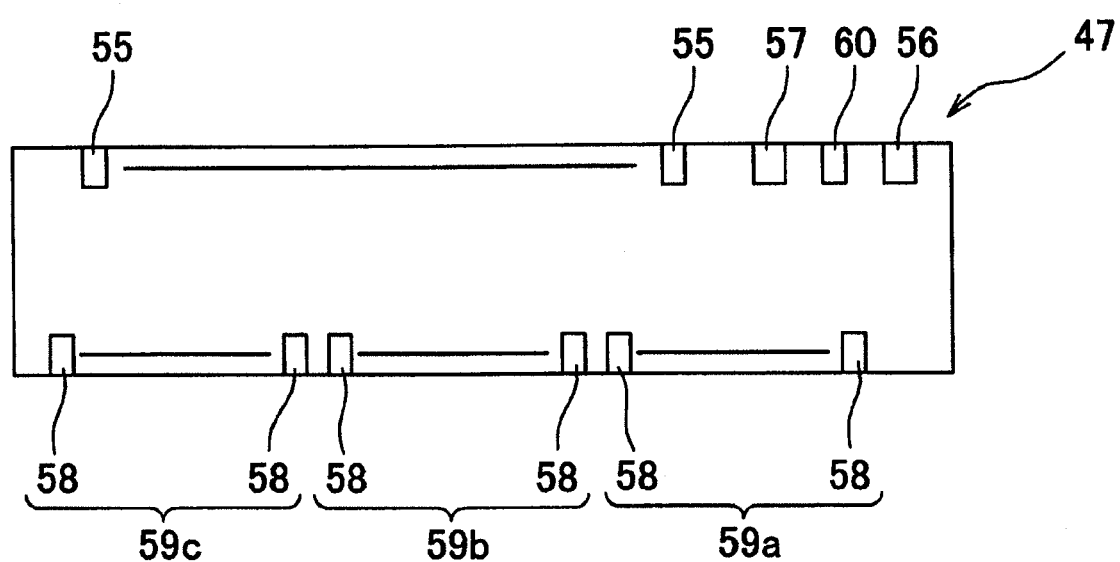
FIG. 11 is a rear view of the driver IC.
Figure 13:
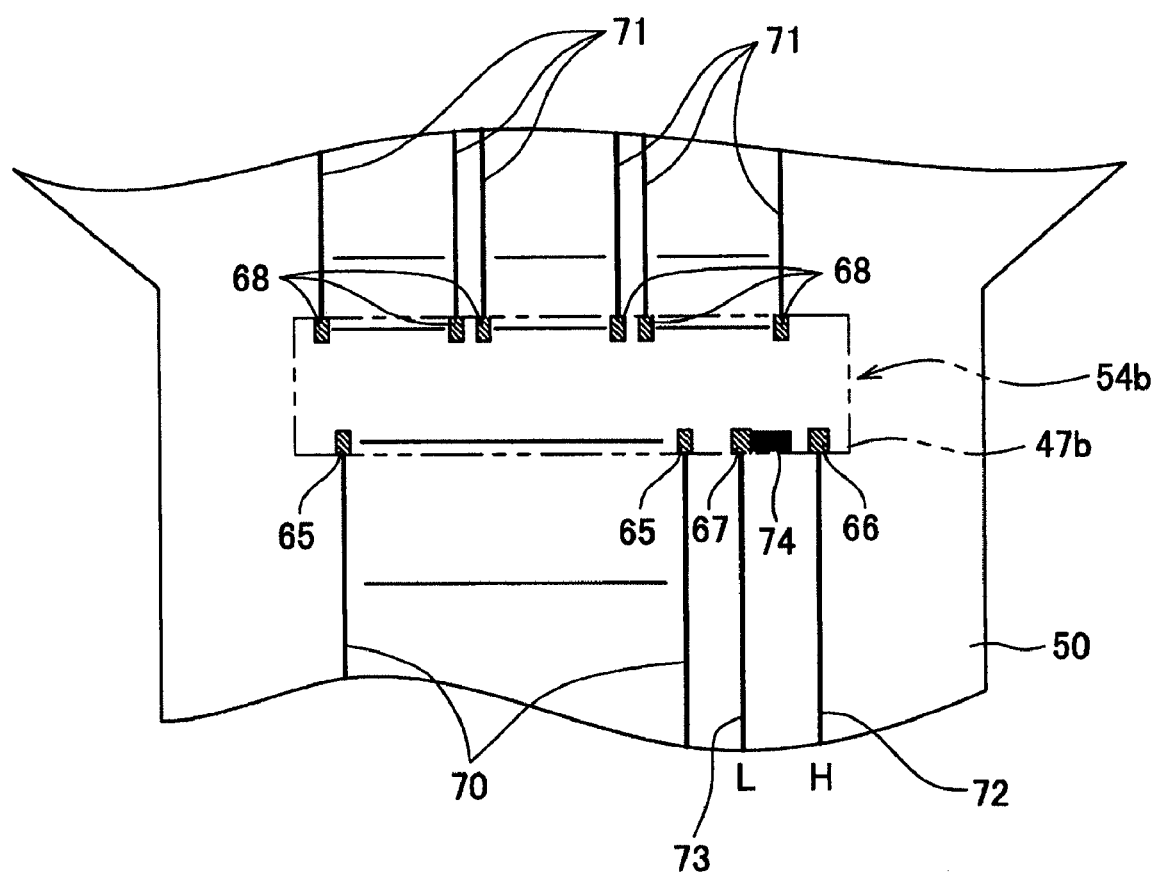
FIG. 13 is a plan view showing the other mounting part on a board.

FIG. 11 is a rear view of the driver IC 47. Further, FIGS. 12 and 13 are enlarged views of the mounting parts 54a and 54b of the board 50 on which the two driver ICs 47 are to be mounted. As shown in FIG. 11, each driver IC 47 is provided, on the rear surface thereof, with: a plurality of input terminals 55 through which various kinds of signals (such as FIRE1 to FIRE6) are inputted from the input part 53 (see FIG. 7) of the FPC 48; an H-signal input terminal 56 (a first input terminal) connected to a low-voltage power supply for driving the driver IC 47; an L-signal input terminal 57 (a first input terminal) connected to the ground; and a plurality of output terminals 58 respectively outputting driving signals to the plurality of individual electrodes 42. Here, in FIG. 11, a large part of the plurality of input terminals 55 and the plurality of output terminals 58 are omitted, and merely a part of them are shown. Further, the plurality of output terminals 58 consist of three output terminal groups 59a, 59b, and 59c for respectively driving the three nozzle rows 32 serving as a driving target of each driver IC 47 (the second, the fourth, or the sixth nozzle row 32, or the first, the third, or the fifth nozzle row 32).

Further, between the H-signal input terminal 56 and the L-signal input terminals 57, a selection signal input terminal 60 (a second input terminal) is arranged apart from the terminals 56 and 57 by a gap. As described later in detail, a signal (a selection signal, a mode selection signal) for selecting which of the two groups of nozzle rows 32 is to be driven and controlled is inputted to the selection signal input terminal 60. Then, the inputted mode selection signal is outputted to a later-described multiplexer 82 (see FIG. 14) in the driver IC 47.

On the other hand, as shown in FIGS. 12 and 13, each of the two mounting parts 54a and 54b which is provided on the board 50 and on which the two driver ICs 47a and 47b are respectively to be mounted is provided with: a plurality of input electrode parts 65 connected respectively to the plurality of input terminals 55 of the driver IC 47; and a plurality of output electrode parts 68 connected respectively to the plurality of output terminals 58. Here, in FIGS. 12 and 13, a large part of the plurality of input electrode parts 65 and the plurality of output electrode parts 68 are omitted and not shown, and merely a part of them are shown. The plurality of input electrode parts 65 are connected respectively to the input part 53 (see FIG. 7) of the board 50 through a plurality of input-side wires 70 formed on the board 50. Further, the plurality of output electrode parts 68 are connected respectively to the plurality of connection terminals 51 arranged in the terminal arrangement region 52 (see FIG. 7) in the center part of the board 50 in correspondence respectively to the plurality of individual electrodes 42 of the piezoelectric actuator 7, through a plurality of output-side wires 71 formed on the board 50.

Further, the mounting part 54 is provided with two input electrode parts 66 and 67 connected respectively to the H-signal input terminal 56 and the L-signal input terminal 57 of the driver IC 47. The two input electrode parts 66 and 67 are connected respectively to wires 72 and 73 corresponding to the wires described in the claim. One wire 72 is connected to the low-voltage power supply of the input part 53. Thus, through the wire 72, a signal (H-signal, VDD1) at a high voltage level equal to the voltage level (e.g., 20 V) of the low-voltage power supply is always inputted to the H-signal input terminal 56 of the driver IC 47. Further, the other wire 73 is connected to the ground of the input part 53. Thus, through the wire 73, a signal (L-signal, COM) at the ground level is always inputted to the L-signal input terminal 57 of the driver IC 47.

Further, in the mounting part 54a shown in FIG. 12, a selection pad 74 composed of an electroconductive member is provided in an input electrode part 66 to which an H signal is to be inputted. The selection pad 74 extends from the input electrode part 66 to a position corresponding to the selection signal input terminal 60 provided in the driver IC 47. Then, when the driver IC 47 is mounted on the mounting part 54a, the selection pad 74 shorts (connects) the H-signal input terminal 56 of the driver IC 47 to the selection signal input terminal 60. That is, in the driver IC 47 mounted on the mounting part 54a, an H signal at a high voltage level inputted through the wire 72 is inputted to the selection signal input terminal 60 via the selection pad 74.

On the other hand, in contrast to the mounting part 54a described above, in the other mounting part 54b shown in FIG. 13, a selection pad 74 composed of an electroconductive member is provided in an input electrode part 67 to which an L signal is to be inputted. The selection pad 74 extends from the input electrode part 67 to a position corresponding to the selection signal input terminal 60 provided in the driver IC 47. Then, when the driver IC 47 is mounted on the mounting part 54b, the selection pad 74 shorts (connects) the L-signal input terminal 57 of the driver IC 47 to the selection signal input terminal 60. That is, in the driver IC 47 mounted on the mounting part 54b, an L signal at a low voltage level (the ground level) inputted through the wire 73 is inputted to the selection signal input terminal 60 via the selection pad 74. Here, the selection pad 74 corresponds to the signal selection part selecting one from two kinds of mode selection signals (selection signals) and then outputting the selected signal to the driver IC 47.

Here, as described above, the plurality of output terminals 58 of the driver IC 47 shown in FIG. 11 consist of three output terminal groups 59a to 59c corresponding to the nozzle rows 32 to be driven. Then, as seen from FIG. 9, when the driver IC 47 is mounted on one mounting part 54a (FIG. 12), the first output terminal group 59a located on the most right-hand side in FIG. 11 drives the second (even-number-th) nozzle row 32b. The second output terminal group 59b located in the center part in FIG. 11 drives the fourth (even-number-th) nozzle row 32d. The third output terminal group 59c located on the most left-hand side drives the fifth (odd-number-th) nozzle row 32e. On the other hand, when the driver IC 47 is mounted on the other mounting part 54b (FIG. 13), its orientation is inverted by 180 degrees in comparison with the case of mounting onto the one mounting part 54a. Thus, the first output terminal group 59a drives the sixth (even-number-th) nozzle row 32f. The second output terminal group 59b drives the third (odd-number-th) nozzle row 32c. The third output terminal group 59c drives the first (odd-number-th) nozzle row 32a.

That is, depending on the driver IC 47 being mounted on which of the mounting parts 54a and 54b, the second output terminal group 59b of each driver IC 47 drives an odd-number-th nozzle row 32 or an even-number-th nozzle row 32. However, in the present embodiment, on the basis of the mode selection signal selected by the selection pad 74 and then inputted to the selection signal input terminal 60, each driver IC 47 recognizes that itself is located on which of the mounting parts 54a and 54b (that is, the second output terminal group 59b is to drive which of an odd-number-th nozzle row and an even-number-th nozzle row). Here, regardless of the driver IC being mounted on which mounting part 54a or 54b, the first output terminal group 59a and the third output terminal group 59c drive an even-number-th nozzle row 32 and an odd-number-th nozzle row 32, respectively. Thus, it is unnecessary that the type (an odd-number-th row or an even-number-th row) of the nozzle row 32 to be driven is switched depending on the mounting position of the driver IC 47.

Figure 14:
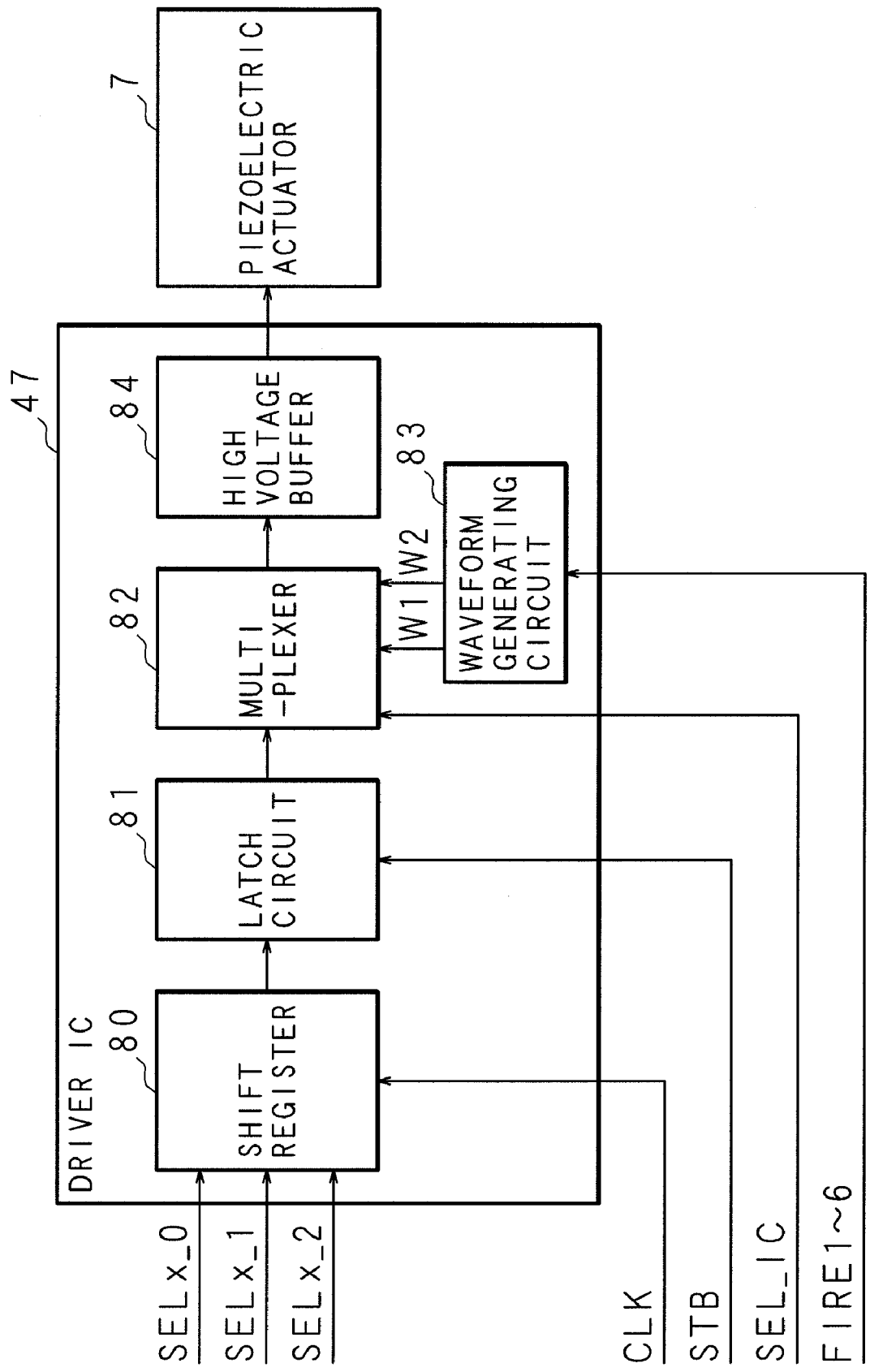
FIG. 14 is a block diagram schematically showing a circuit configuration of the driver IC.

Next, the circuit configuration of the driver IC 47 is described below with reference to FIG. 14. As shown in FIG. 14, the driver IC 47 has a shift register 80, a latch circuit 81, a multiplexer 82, a waveform generating circuit 83, and a high voltage buffer 84.

Selection data of 3 bits corresponding to each nozzle 30 (an output terminal 58 through which a driving signal is to be outputted) serving as a driving target is serially inputted from the control circuit board 9 to the shift register 80 through the four signal input parts SIN_0 to SIN_3 in synchronization with the data transfer clock signal (CLK). Here, the 3-bit selection data is data for selecting one from the six ejection modes as shown in FIG. 8. In an example, selection data for selecting "no ejection" in FIG. 8 is assigned to "000", selection data for selecting "small droplet size (S1)" in FIG. 8 is assigned to "001", and so on. Then, one from the six ejection modes is selected on the basis of the selection data. Then, the shift register 80 successively holds the 3-bit selection data inputted serially. Then, on completion of transfer of the selection data concerning all output terminals 58, the shift register 80 converts the 3-bit selection data into parallel signals, and then outputs the signals in parallel to the latch circuit 81. Here, the 3-bit selection data may be serially inputted from the control circuit board 9 to the shift register 80 through the one signal input part (a single signal line) of the driver IC 47. However, from the perspective of improvement in the transfer rate, in the present embodiment, as shown in FIG. 14, the selection data is serially inputted through the four signal input parts (SIN_0 to SIN_3).

In response to a strobe control signal (STB) inputted from the control circuit board 9, the latch circuit 81 outputs the parallel-converted 3-bit selection data (SELx_0 to _2) respectively corresponding to all output terminals 58, to the multiplexer 82 at a predetermined timings.

Six kinds of driving waveform data (FIRE1 to FIRE6) respectively corresponding to the six ejection modes are inputted to the waveform generating circuit 83. Then, on the basis of the six kinds of driving waveform data, the waveform generating circuit 83 (driving signal generating part) generates: six kinds of waveform data for driving an odd-number-th nozzle row 32; and six kinds of waveform data for driving an even-number-th nozzle row 32 whose timing of pulse-application is delayed relative to the waveform for driving an odd-number-th nozzle row 32. Further, on the basis of the selection data inputted from the latch circuit 81, for each output terminal 58, the multiplexer 82 selects one from the driving waveforms generated by the waveform generating circuit 83.

Here, as described above, the type (an odd-number-th row or an even-number-th row) of the nozzle row 32 to be driven by the output terminal group 59 (especially the second output terminal group 59b) of the driver IC 47 varies depending on the driver IC 47 being mounted on which of the two mounting parts 54a and 54b. Thus, the waveform generating circuit 83 outputs to the multiplexer 82 two waveform data groups to be used when the driver ICs 47 are mounted on the two mounting parts 54a and 54b, respectively. On the other hand, the multiplexer 82 receives an H signal or an L signal as a mode selection signal from the selection signal input terminal 60. Then, on the basis of the inputted mode selection signal, the multiplexer 82 selects one of the two waveform data groups generated by the waveform generating circuit 83.

Figure 15:
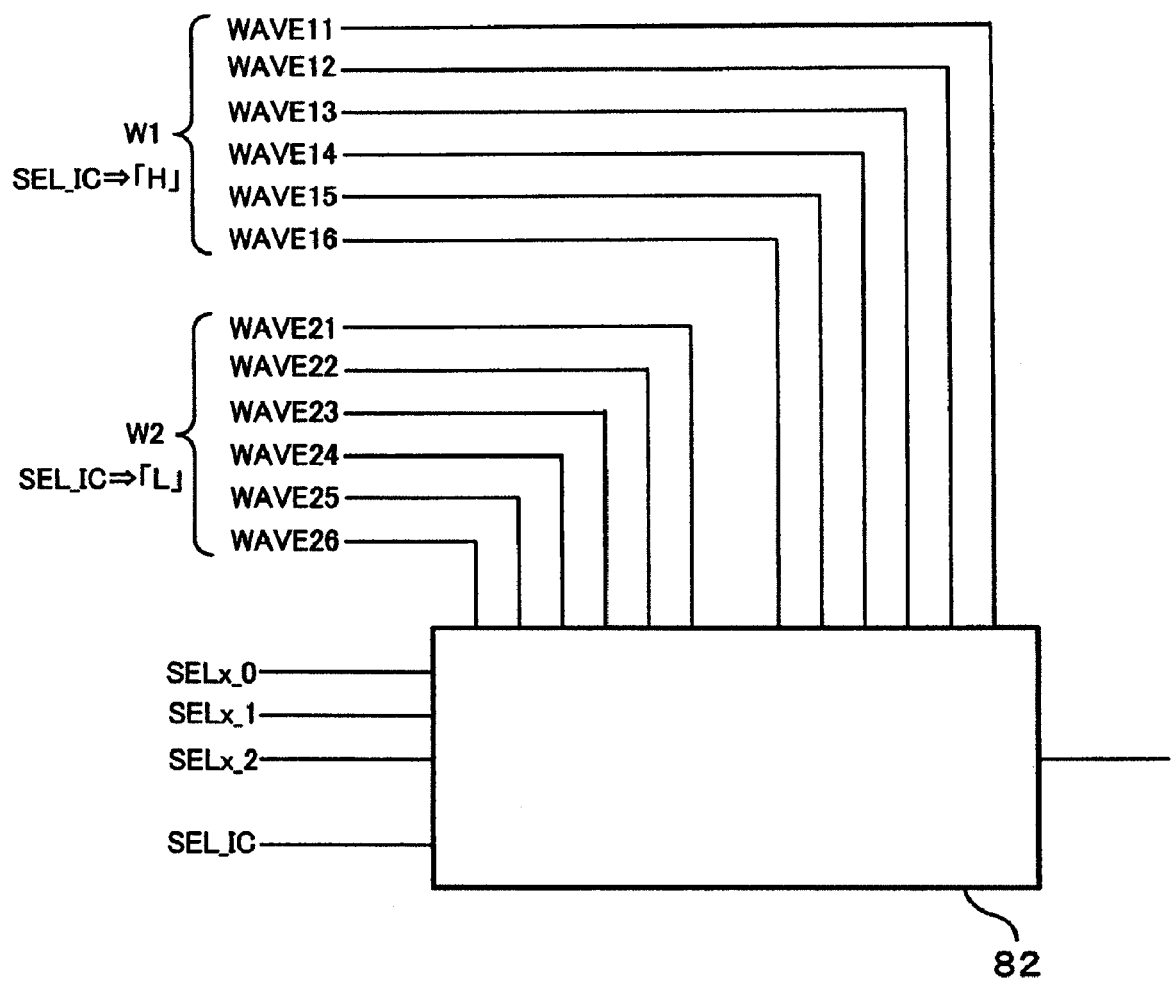
FIG. 15 is a block diagram of a multiplexer inside the driver IC.

FIG. 15 is a block diagram schematically showing the multiplexer 82. Here, in FIG. 15, SELx_0 to _2 (x is the output terminal 58 number) indicates the 3-bit selection data inputted in correspondence to each output terminal 58 from the latch circuit 81.

SEL_IC is a mode selection signal (H-signal or L signal) inputted from the FPC 48. As shown in FIG. 15, the multiplexer 82 receives the 3-bit selection data (SELx_0 to _2) from the latch circuit 81, and receives two waveform data groups (W1 and W2) corresponding respectively the two mounting parts 54a and 54b from the waveform generating circuit 83. Further, the multiplexer 82 receives the mode selection signal (SEL_IC) through the selection signal input terminal 60.

In the two waveform data groups W1 and W2, the waveform data group W1 corresponds to the mounting part 54a while the waveform data group W2 corresponds to the mounting part 54b. The waveform data group W1 corresponds to the driving waveform data FIRE1 to FIRE6 inputted from the control circuit board 9, and contains six kinds of driving waveforms WAVE11 to WAVE16. Similarly, the waveform data group W2 corresponds to the driving waveform data FIRE1 to FIRE6, and contains six kinds of driving waveforms WAVE21 to WAVE26. Here, whether each of the two waveform data groups W1 and W2 is assigned to waveform data for driving an odd-number-th nozzle row or waveform data for driving an even-number-th nozzle row depends on whether each output terminal 58 belongs to which of the three output terminal groups 59a to 59c.

FIG. 16 is a diagram showing the relation between the three output terminal groups 59a to 59c and the type of the driving waveform contained in the two waveform data groups W1 and W2. As shown in FIG. 16, for example, in the output terminal 58 belonging to the second output terminal group 59b, six kinds of waveform data for driving an even-number-th nozzle row is inputted as the waveform data group W1 from the waveform generating circuit 83 to the multiplexer 82, and six kinds of waveform data for driving an odd-number-th nozzle row is inputted as the waveform data group W2.

On the basis of the mode selection signal SEL_IC inputted from the selection signal input terminal 60, the multiplexer 82 determines to select which of the two waveform data groups W1 and W2 inputted from the waveform generating circuit 83. That is, when the inputted mode selection signal SEL_IC is "H", it is determined as being mounted on the mounting part 54a shown in FIG. 12, and then the waveform data group W1 is selected. In contrast, when the inputted mode selection signal SEL_IC is "L", it is determined as being mounted on the mounting part 54b shown in FIG. 13, and then the waveform data group W2 is selected. Then, among the six kinds of driving waveforms contained in the selected waveform data group, one driving waveform corresponding to the 3-bit selection data (SELx_0 to _2) is determined. Here, the multiplexer 82 of the present embodiment corresponds to the processing part of the present invention that in accordance with the mode selection signal corresponding to the mounting position, selects any one of two waveform data groups W1 and W2 so as to determine the driving waveform of the driving signal, and thereby selectively executes one of plural kinds of process modes.

The driving waveform determined as described above is amplified by the high voltage buffer 84 so that a driving signal having a predetermined voltage level (e.g., 20 V) is obtained. Then, the driving signal having a predetermined driving waveform is outputted from the output terminal 58 connected to the high voltage buffer 84, to the individual electrode 42 corresponding to the nozzle 30 serving as a driving target.

Here, as described above, among the three output terminal groups 59a to 59c of the driver IC 47, the first output terminal group 59a and the third output terminal group 59c drive the nozzle row 32 of the same type (an odd-number-th row or an even-number-th row) regardless of the driver IC 47 being mounted on whichever of the mounting parts 54a and 54b. Thus, it is unnecessary that the type (an odd-number-th row or an even-number-th row) of the nozzle row 32 to be driven is switched depending on the mounting position. This is because the three nozzle rows 32 to be driven by one driver IC 47 include both an odd-number-th nozzle row 32 and an even-number-th nozzle row 32.

In the two driver ICs 47, one driver IC 47 may drive odd-number-th nozzle rows 32 (the first, the third, and the fifth rows), while the other driver IC 47 may drive even-number-th nozzle rows 32 (the second, the fourth, and the sixth rows). Nevertheless, in this configuration, depending on the driver IC being mounted on which of the mounting parts 54a and 54b, the type of the nozzle rows 32 to be driven varies for all the three output terminal groups 59a to 59c. In contrast, in the present embodiment, one driver IC 47 drives an odd-number-th nozzle row 32 and an even-number-th nozzle row 32. Thus, in the first output terminal group 59a and the third output terminal group 59c, the type of the nozzle row 32 to be driven need not be changed. That is, at the time when the multiplexer 82 determines the driving waveform for the output terminals 58 belonging to the first output terminal group 59a and the third output terminal group 59c, since the six kinds of driving waveforms belonging to the waveform data group W1 are the same as the six kinds of driving waveforms belonging to the waveform data group W2, selection of one from the two waveform data groups W1 and W2 becomes unnecessary. This simplifies the circuit configuration of the multiplexer 82.

In the ink jet printer 1 of the present embodiment, each of the two mounting parts 54a and 54b of the board 50 of the FPC 48 is provided with the selection pad 74 for shorting one of the wires 72 and 73 for respectively transmitting the two kinds of mode selection signals (an H-signal and an L signal), to the selection signal input terminal 60 of the driver IC 47. Then, when the two driver ICs 47 are mounted respectively onto the two mounting parts 54a and 54b, any one of the two kinds of mode selection signals is selected by the selection pad 74 provided in each mounting part 54, and then inputted to each driver IC 47.

According to such a configuration, when the two driver ICs 47 are merely mounted respectively onto the two mounting parts 54a and 54b, each driver IC 47 recognizes the driver IC being mounted on which of the mounting parts 54 and hence which driving mode being to be executed (the driving signal being to be outputted to which nozzle row 32). This allows the use of two driver ICs 47 having the same circuit configuration, and hence avoids the necessity of dedicated circuit configurations each corresponding to a driving mode to be executed. Further, since the selection pad 74 for selecting the driving mode is provided on the FPC 48 side, any special circuit for selecting the driving mode is not necessary on the driver IC 47 side. This provides an advantage concerning the cost. Further, also in the control circuit board 9 for transmitting signals to the driver IC 47, a circuit for selecting and transmitting a particular mode selection signal to each driver IC 47 is unnecessary. Thus, it is sufficient that the control circuit board 9 merely transmits both of the two kinds of mode selection signals to each driver IC 47. This simplifies the circuit configuration in both of the driver ICs 47 and the control circuit board 9, and hence reduces the cost also in this point.

Further, the electroconductive selection pad 74 provided on the board 50 and shorting one of the H-signal input terminal 56 and the L-signal input terminals 57 to the selection signal input terminal 60 is a remarkably simple configuration. Yet, this remarkably simple configuration allows each driver IC 47 to recognize which nozzle row 32 being to be driven.

Further, it is sufficient that as the mode selection signals of the driver IC 47, two kinds of constant voltage signals at mutually different voltage levels (an H-signal and an L signal) are transmitted to the driver IC 47. This avoids the necessity of providing a complicated signal generating circuit on the control circuit board 9. Further, when a signal at the ground level (an L signal) and a signal (an H signal) at the voltage level of the low-voltage power supply (a power supply for control) for driving the driver IC 47 are employed as the two kinds of constant voltage signals, the necessity of newly generating signals having special voltage levels is avoided. This simplifies the circuit configuration of the control circuit board 9.

The following description is given concerning modifications obtained by adding various kinds of changes to the embodiment given above. Here, like configuration components to those of the embodiment given above are designated by like numerals, and their description is omitted appropriately.

1] In the embodiment given above, an example that the driver ICs 47 for driving the piezoelectric actuator 7 selectively execute two different driving modes has been described for a case that mutually different driving signals are outputted for driving an odd-number-th nozzle row 32 and for driving an even-number-th nozzle row 32. However, the driving modes to be executed by the driver ICs 47 are not limited to these. An example is described below.

A prior art technique has been known that in a so-called color ink jet head provided with plural kinds of nozzles respectively for ejecting plural kinds (plural colors) of ink, different kinds of driving signals (driving waveforms) are used depending on the type of ink. For example, it is preferable that color ink used in image printing of a photograph or the like is ejected in a small droplet size. In contrast, it is preferable that black ink used mainly in text printing is ejected in a relatively large droplet size. Thus, mutually different driving signals (driving waveforms) are outputted from the output terminals 58 of the driver IC 47 between a case that the nozzle 30 ejecting color ink is to be driven and a case that the nozzle 30 ejecting black ink is to be driven. Accordingly, when the type of the nozzle 30 (the type of ink to be ejected) corresponding to each output terminal 58 varies depending on the mounting position of the driver IC 47, the present invention, may be employed.

2] The number of driver ICs 47 mounted on the board 50 is not limited to two. That is, three or more driver ICs 47 may be mounted on the board 50. Here, each of the three or more driver ICs 47 may perform a drive control process different from each other. Alternatively, a part of the three or more driver ICs 47 may execute the same process.

3] The signal selection part that is provided on the board 50 and that selects one from the plural kinds of mode selection signals and then outputs the selected signal to the driver IC 47 is not limited to a configuration for shorting two input terminals of the driver IC 47 like the selection pad 74 of the embodiment given above. For example, a dedicated circuit selecting one from plural kinds of mode selection signals respectively inputted through a plurality of wires and then outputting the selected signal to the driver IC 47 may be provided on the board 50.

The embodiment given above and its modifications have been described for a case that the present invention is applied to a wiring board for driving the actuator of an ink jet head. However, targets of application of the present invention are not limited to such a wiring board. That is, the present invention may be applied regardless of the application as long as the target is a wiring board on which a plurality of ICs are mounted and in which each IC is provided with a processing part selectively executing plural kinds of process modes whose contents of process differ from each other.

In the embodiment given above and its modifications, each IC is provided with: a plurality of wires for transmitting mode selection signals; a plurality of first input terminals connected respectively to these; and a second input terminal outputting the signal to the processing part. On the other hand, on the board, an electroconductive member is arranged as a signal selection part. Then, when an IC is mounted onto the board, any one of the plurality of first input terminals of the IC is shorted to the second input terminal by the electroconductive member. Thus, the mode selection signal inputted to the shorted one of the first input terminals is outputted through the second input terminal to the processing part. According to such a configuration, the on-the-board remarkably simple configuration composed of an electroconductive member shorting one of the plurality of first input terminals to the second input terminal allows selection of the process mode to be executed by the processing part of each IC.

According to such a configuration, it is sufficient that as plural kinds of mode selection signals, constant voltage signals at mutually different voltage levels are merely transmitted respectively through the wires. This avoids the necessity of a complicated signal generating circuit, and simplifies the circuit configuration on the transmission side transmitting the mode selection signals to the IC.

According to such a configuration, when a signal at the ground level and a signal at a voltage level of the power supply (a power supply for control) for driving the ICs are employed as two kinds of signals included in the plural kinds of mode selection signals, this reduces the necessity of generating signals having special voltage levels other than the ground level and the voltage level of the IC driving power supply. This simplifies further the circuit configuration on the transmission side.

In a configuration provided with a plurality of recording elements and with a wiring board transmitting driving signals for driving the plurality of recording elements to the plurality of recording elements, with taking into consideration the difficulty and the like in the arrangement of wires in a case that all recording elements are driven by a single IC, an approach may be adopted that the plurality of recording elements consist of a plurality of recording element groups and then the plurality of recording element groups are driven respectively by a plurality of ICs mounted on the board. In this situation, in some cases, the driving signal to be outputted varies depending on the driving signal being to be outputted to which recording element group from each IC. Thus, the contents of the process (the contents of driving mode) to be executed by each IC varies. Accordingly, in the present invention, the processing part of each IC determines the driving mode in accordance with the mode selection signal selected by the signal selection part, and then provides a driving signal corresponding to the driving mode to the recording element group.

In a configuration that a plurality of recording elements of a recording head consist of a plurality of recording element rows, in some cases, mutually different driving signals outputted from an IC are employed between adjacent recording element rows. An exemplary case is that if adjacent recording element rows were driven at the same timing, interference would occur in their recording operation, thus, countermeasure that their driving timing or the like is shifted to each other is taken. In this case, a situation arises that the driving signal outputted from each IC is different from each other between a case that a recording element group containing an odd-number-th recording element row is to be driven and a case that a recording element group containing an even-number-th recording element row is to be driven. That is, the contents of process are different from each other between the driving modes of driving the two recording element groups. Thus, the processing part of each IC determines which driving mode is to be executed in accordance with the mode selection signal selected by the signal selection part.

In a case that the driving signal for driving an odd-number-th recording element row is different from the driving signal for driving an even-number-th recording element row, if all odd-number-th recording element rows were driven by one IC and all even-number-th recording element rows were driven by the other IC, the driving signals outputted from all output terminals of each IC to the recording elements vary completely for each driving mode. In this case, the driving signal need be determined for each of all output terminals in accordance with each driving mode selected by the mode selection signal. This causes a complicated circuit configuration.

In the present invention, one recording element group contains a part of odd-number-th recording element rows and a part of even-number-th recording element rows. That is, in each of the two driving modes respectively for driving the two recording element groups, an odd-number-th recording element row and an even-number-th recording element row are both driven. Thus, output terminals are present whose driving signals to be outputted do not vary (output terminals always driving an odd-number-th or even-number-th recording element row) regardless of whichever driving mode being selected. Such output terminals always output the same driving signals regardless of the driving mode. This simplifies the configuration of the circuit determining the driving signals.

As this description may be embodied in several forms without departing from the spirit of essential characteristics thereof, the embodiment given above is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

What is claimed is:

1. A wiring board comprising:
a board;
a plurality of ICs mounted on the board and specifications of the ICs being the same;
a plurality of wires provided on the board and transmitting respectively, to the ICs, a plurality of mode selection signals respectively corresponding to a plurality kinds of process modes whose contents of a process differ from each other; and
a signal selection part provided on the board, selecting one from the plurality of mode selection signals transmitted through the plurality of wires and then outputting the selected mode selection signal to each IC, wherein
each IC has a processing part selecting one from the plurality kinds of process modes according to the mode selection signal inputted from the signal selection part, and then performing the selected one kind of process mode,
each IC includes a plurality of first input terminals connected respectively to the plurality of wires and a second input terminal provided apart from the plurality of first input terminals and outputting to the processing part the mode selection signal inputted from the signal selection part,
the plurality of mode selection signals respectively corresponding to the plurality kinds of process modes are inputted from the plurality of wires to the plurality of first input terminals, respectively, and
the signal selection part connects one of the plurality of first input terminals provided in each IC, to the second input terminal, according to a position in which the IC is mounted on the board.

2. The wiring board according to claim 1, wherein
a plurality of the signal selection parts are provided, and each of the plurality of signal selection parts is composed of an electroconductive member connecting one of the plurality of first input terminals provided in each IC, to the second input terminal, according to a position in which the IC is mounted on the board.

3. The wiring board according to claim 2, further comprising a control circuit board provided on the board and outputting the plurality of mode selection signals through the wires to the first input terminals.

4. The wiring board according to claim 1, wherein
the plurality of mode selection signals include signals each having a constant voltage whose voltage level is different from each other.

5. The wiring board according to claim 4, wherein the plurality of mode selection signals include a signal having a ground level and a signal having an output voltage level of a power supply driving the ICs.

6. A recording head comprising:
a plurality of recording elements; and
a wiring board providing, to the plurality of recording elements, driving signals for driving the plurality of recording elements, wherein
the wiring board is a wiring board according to claim 1,
the plurality of recording elements consist of a plurality of recording element groups, and
on the basis of the mode selection signal inputted from the signal selection part, each of the plurality of processing parts selects one driving signal group from a plurality of driving signal groups for each of the plurality of recording element groups, then selects from the selected driving signal group a driving signal for driving the recording element, and then transmits the selected signal to the recording element.

7. The recording head according to claim 6, wherein
the plurality of recording elements consist of a plurality of recording element rows arranged in a matrix form,
the driving signal outputted from each IC to an odd-number-th recording element rows in one direction of the matrix form arrangement and the driving signal outputted from each IC to an even-number-th recording element rows in the one direction have different driving waveforms from each other,
two of the ICs are mounted on the board, and the plurality of recording elements consist of two recording element groups to be driven respectively by the two ICs, and
in the two recording element groups, one recording element group includes at least a part of the odd-number-th recording element rows, and the other recording element group includes at least a part of the even-number-th recording element rows.

8. The recording head according to claim 7, wherein the two recording element groups respectively include the odd-number-th recording element row and the even-number-th recording element row.

9. The recording head according to claim 6, wherein
the plurality of recording element groups include a first recording element group and a second recording element group,
the plurality of driving signal groups include a first driving signal group for the first recording element group and a second driving signal group for the second recording element group having a driving waveform different from that of the first driving signal group.

10. The recording head according to claim 6, wherein
the plurality of recording element groups includes a first recording element group for monochrome recording and a second recording element group for color recording, and
the plurality of driving signal groups includes a first driving signal group for the first recording element group and a second driving signal group for the second recording element group.

11. The recording head according to claim 6, wherein each IC has a driving signal generating part generating the plurality of driving signal groups and then outputting the signals to the processing part.

12. A recording head comprising:
- a plurality of recording elements; and
- a wiring board providing, to the plurality of recording elements, driving signals for driving the plurality of recording elements, wherein
- the wiring board is a wiring board according to claim 1,
- the plurality of recording elements consist of a plurality of recording element groups, and
- on the basis of the mode selection signal inputted from the signal selection part, the processing part of each IC selects one from the plural kinds of process modes respectively for driving the plurality of recording element groups and then executes the selected process mode.

* * * * *